United States Patent
Haneda

(10) Patent No.: US 8,902,092 B2
(45) Date of Patent: Dec. 2, 2014

(54) ANALOG-DIGITAL CONVERSION CIRCUIT AND METHOD

(71) Applicant: Fujitsu Semiconductor Limited, Yokohama, Kanagawa (JP)

(72) Inventor: Hidetaka Haneda, Seto (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/147,144

(22) Filed: Jan. 3, 2014

(65) Prior Publication Data

US 2014/0191889 A1 Jul. 10, 2014

(30) Foreign Application Priority Data

Jan. 9, 2013 (JP) ................................. 2013-001889

(51) Int. Cl.
*H03M 1/06* (2006.01)

(52) U.S. Cl.
CPC ...................................... *H03M 1/06* (2013.01)
USPC ........... 341/118; 341/119; 341/120; 341/155; 341/164; 341/165

(58) Field of Classification Search
CPC ... H03M 1/468; H03M 1/181; H03M 1/1047; H03M 1/12; H03M 1/0607; H03M 1/804; H03M 1/06; H03M 1/785; H03M 1/10; H03M 1/1023; H03M 1/185
USPC .......................... 341/118, 120, 155, 164, 165
See application file for complete search history.

(56) References Cited

U.S. PATENT DOCUMENTS

| | | | | |
|---|---|---|---|---|
| 4,415,882 A | * | 11/1983 | Akazawa et al. | 341/156 |
| 5,218,362 A | * | 6/1993 | Mayes et al. | 341/121 |
| 5,644,308 A | * | 7/1997 | Kerth et al. | 341/120 |
| 5,684,487 A | * | 11/1997 | Timko | 341/172 |
| 6,380,881 B2 | * | 4/2002 | Harada et al. | 341/165 |
| 6,714,151 B2 | * | 3/2004 | Tachibana et al. | 341/155 |
| 6,717,542 B2 | | 4/2004 | Harada | |
| 7,119,730 B2 | * | 10/2006 | San et al. | 341/163 |
| 7,583,201 B1 | * | 9/2009 | Yessayan | 340/815.4 |
| 7,830,295 B2 | | 11/2010 | Ikeda et al. | |
| 7,880,650 B2 | * | 2/2011 | Feddeler et al. | 341/120 |
| 8,094,057 B2 | * | 1/2012 | Haneda | 341/162 |
| 2011/0133971 A1 | * | 6/2011 | Ogawa et al. | 341/155 |
| 2012/0206283 A1 | * | 8/2012 | von Staudt | 341/121 |
| 2013/0194115 A1 | * | 8/2013 | Wu et al. | 341/110 |

FOREIGN PATENT DOCUMENTS

| | | | |
|---|---|---|---|
| JP | 2003-283336 A | 10/2003 | |
| JP | 2010-016466 A | 1/2010 | |

* cited by examiner

*Primary Examiner* — Linh Nguyen
(74) *Attorney, Agent, or Firm* — Arent Fox LLP

(57) ABSTRACT

An analog-digital conversion circuit includes a comparator that receives an analog input signal. A controller generates an N1-bit first signal and an N2B-bit second signal in accordance with an output signal from the comparator. A first digital-analog converter generates a first reference signal from the first signal. A second digital-analog converter generates a second reference signal from the second signal. A correction circuit corrects the first and second signals to generate a digital output signal. The N2B-bit second signal is acquired by adding a Kbit correction signal to an N2A-bit signal. The controller sequentially sets bit values of the first signal and bit values of the second signal in accordance with the output signal of the comparator. The correction circuit generates the (N1+N2A)-bit digital output signal based on a sum of a value acquired by multiplying the N1-bit first signal by $2^{N2A}$ and a value of the N2B-bit second signal.

8 Claims, 13 Drawing Sheets

Fig.2

| Step | High-Order DAC Code | Low-Order DAC Code | Comparison Reference Signal | Redundancy |
|---|---|---|---|---|
| 1st Comparison | 2 | 2 | 8LSB | ±2LSB |
| 2nd Comparison | Add "+1" to the previous value when the previous comparison result is "H" | 2 | Add "+4LSB" to the previous value when the previous comparison result is "H" | ±2LSB |
|  | Add "-1" to the previous value when the previous comparison result is "L" |  | Add "-4LSB" to the previous value when the previous comparison result is "L" |  |
| 3rd Comparison | Hold the previous value when the previous comparison result is "H" | 4 | Add "+2LSB" to the previous value when the previous comparison result is "H" | None |
|  | Add "-1" to the previous value when the previous comparison result is "L" |  | Add "-2LSB" to the previous value when the previous comparison result is "L" |  |
| 4th Comparison | Hold the previous value | Add "+2" to the previous value when the previous comparison result is "H" | Add "+2LSB" to the previous value when the previous comparison result is "H" | None |
|  |  | Add "-2" to the previous value when the previous comparison result is "L" | Add "-2LSB" to the previous value when the previous comparison result is "L" |  |
| 5th Comparison | Hold the previous value | Add "+1" to the previous value when the previous comparison result is "H" | Add "+1LSB" to the previous value when the previous comparison result is "H" | None |
|  |  | Add "-1" to the previous value when the previous comparison result is "L" | Add "-1LSB" to the previous value when the previous comparison result is "L" |  |

| IN2 | IN1 | IN0 | C6 | C5 | C4 | C3 | C2 | C1 | C0 |
|---|---|---|---|---|---|---|---|---|---|
| 0 | 0 | 0 | 0 | 0 | 0 | 0 | 0 | 0 | 1 |
| 0 | 0 | 1 | 0 | 0 | 0 | 0 | 0 | 1 | 0 |
| 0 | 1 | 0 | 0 | 0 | 0 | 0 | 1 | 0 | 0 |
| 0 | 1 | 1 | 0 | 0 | 0 | 1 | 0 | 0 | 0 |
| 1 | 0 | 0 | 0 | 0 | 1 | 0 | 0 | 0 | 0 |
| 1 | 0 | 1 | 0 | 1 | 0 | 0 | 0 | 0 | 0 |
| 1 | 1 | 0 | 1 | 0 | 0 | 0 | 0 | 0 | 0 |
| 1 | 1 | 1 | 0 | 0 | 0 | 0 | 0 | 0 | 0 |

Fig.6

| High-Order DAC | | Low-Order DAC | | | A4 | A3 | A2 | A1 | A0 | B5 | B4 | B3 | B2 | B1 | B0 | A/D Conversion Result | | | |
|---|---|---|---|---|---|---|---|---|---|---|---|---|---|---|---|---|---|---|---|
| DU1 | DU0 | DL2 | DL1 | DL0 | | | | | | | | | | | | D3 | D2 | D1 | D0 |
| 1 | 1 | 1 | 1 | 1 | 1 | 0 | 0 | 1 | 1 | 0 | 1 | 0 | 0 | 0 | 1 | 1 | 1 | 1 | 1 |
| 1 | 1 | 1 | 1 | 0 | 1 | 0 | 0 | 1 | 0 | 0 | 1 | 0 | 0 | 0 | 0 | 1 | 1 | 1 | 1 |
| 1 | 1 | 1 | 0 | 1 | 1 | 0 | 0 | 0 | 1 | 0 | 0 | 1 | 1 | 1 | 1 | 1 | 1 | 1 | 1 |
| 1 | 1 | 1 | 0 | 0 | 1 | 0 | 0 | 0 | 0 | 0 | 0 | 1 | 1 | 1 | 0 | 1 | 1 | 1 | 0 |
| 1 | 1 | 0 | 1 | 1 | 0 | 1 | 1 | 1 | 1 | 0 | 0 | 1 | 1 | 0 | 1 | 1 | 1 | 0 | 1 |
| 1 | 1 | 0 | 1 | 0 | 0 | 1 | 1 | 1 | 0 | 0 | 0 | 1 | 1 | 0 | 0 | 1 | 1 | 0 | 0 |
| 1 | 1 | 0 | 0 | 1 | 0 | 1 | 1 | 0 | 1 | 0 | 0 | 1 | 0 | 1 | 1 | 1 | 0 | 1 | 1 |
| 1 | 1 | 0 | 0 | 0 | 0 | 1 | 1 | 0 | 0 | 0 | 0 | 1 | 0 | 1 | 0 | 1 | 0 | 1 | 0 |
| 1 | 0 | 1 | 1 | 1 | 0 | 1 | 1 | 1 | 1 | 0 | 0 | 1 | 1 | 0 | 1 | 1 | 1 | 0 | 1 |
| 1 | 0 | 1 | 1 | 0 | 0 | 1 | 1 | 1 | 0 | 0 | 0 | 1 | 1 | 0 | 0 | 1 | 1 | 0 | 0 |
| 1 | 0 | 1 | 0 | 1 | 0 | 1 | 1 | 0 | 1 | 0 | 0 | 1 | 0 | 1 | 1 | 1 | 0 | 1 | 1 |
| 1 | 0 | 1 | 0 | 0 | 0 | 1 | 1 | 0 | 0 | 0 | 0 | 1 | 0 | 1 | 0 | 1 | 0 | 1 | 0 |
| 1 | 0 | 0 | 1 | 1 | 0 | 1 | 0 | 1 | 1 | 0 | 0 | 1 | 0 | 0 | 1 | 1 | 0 | 0 | 1 |
| 1 | 0 | 0 | 1 | 0 | 0 | 1 | 0 | 1 | 0 | 0 | 0 | 1 | 0 | 0 | 0 | 1 | 0 | 0 | 0 |
| 1 | 0 | 0 | 0 | 1 | 0 | 1 | 0 | 0 | 1 | 0 | 0 | 0 | 1 | 1 | 1 | 0 | 1 | 1 | 1 |
| 1 | 0 | 0 | 0 | 0 | 0 | 1 | 0 | 0 | 0 | 0 | 0 | 1 | 1 | 0 | 0 | 1 | 1 | 1 | 0 |
| 0 | 1 | 1 | 1 | 1 | 0 | 1 | 0 | 1 | 1 | 0 | 0 | 1 | 0 | 0 | 1 | 1 | 0 | 0 | 1 |
| 0 | 1 | 1 | 1 | 0 | 0 | 1 | 0 | 1 | 0 | 0 | 0 | 1 | 0 | 0 | 0 | 1 | 0 | 0 | 0 |
| 0 | 1 | 0 | 1 | 1 | 0 | 1 | 0 | 0 | 1 | 0 | 0 | 0 | 1 | 1 | 1 | 0 | 1 | 1 | 1 |
| 0 | 1 | 1 | 0 | 0 | 0 | 1 | 0 | 0 | 0 | 0 | 0 | 1 | 1 | 0 | 0 | 0 | 1 | 1 | 0 |
| 0 | 1 | 0 | 1 | 1 | 0 | 0 | 1 | 1 | 1 | 0 | 0 | 0 | 1 | 0 | 1 | 0 | 1 | 0 | 1 |
| 0 | 1 | 0 | 1 | 0 | 0 | 0 | 1 | 1 | 0 | 0 | 0 | 0 | 1 | 0 | 0 | 0 | 1 | 0 | 0 |
| 0 | 1 | 0 | 0 | 1 | 0 | 0 | 1 | 0 | 1 | 0 | 0 | 0 | 1 | 1 | 0 | 0 | 1 | 1 | 1 |
| 0 | 1 | 0 | 0 | 0 | 0 | 0 | 1 | 0 | 0 | 0 | 0 | 0 | 1 | 0 | 0 | 0 | 0 | 1 | 0 |
| 0 | 0 | 1 | 1 | 1 | 0 | 0 | 1 | 1 | 1 | 0 | 0 | 0 | 1 | 0 | 1 | 0 | 1 | 0 | 1 |
| 0 | 0 | 1 | 1 | 0 | 0 | 0 | 1 | 1 | 0 | 0 | 0 | 0 | 1 | 0 | 0 | 0 | 1 | 0 | 0 |
| 0 | 0 | 1 | 0 | 1 | 0 | 0 | 1 | 0 | 1 | 0 | 0 | 0 | 1 | 1 | 0 | 0 | 1 | 1 | 1 |
| 0 | 0 | 1 | 0 | 0 | 0 | 0 | 1 | 0 | 0 | 0 | 0 | 0 | 1 | 0 | 0 | 0 | 0 | 1 | 0 |
| 0 | 0 | 0 | 1 | 1 | 0 | 0 | 0 | 1 | 1 | 0 | 0 | 0 | 0 | 0 | 1 | 0 | 0 | 0 | 1 |
| 0 | 0 | 0 | 1 | 0 | 0 | 0 | 0 | 1 | 0 | 0 | 0 | 0 | 0 | 0 | 0 | 0 | 0 | 0 | 0 |
| 0 | 0 | 0 | 0 | 1 | 0 | 0 | 0 | 0 | 1 | 1 | 1 | 1 | 1 | 1 | 0 | 0 | 0 | 0 | 0 |
| 0 | 0 | 0 | 0 | 0 | 0 | 0 | 0 | 0 | 0 | 1 | 1 | 1 | 1 | 1 | 0 | 0 | 0 | 0 | 0 |

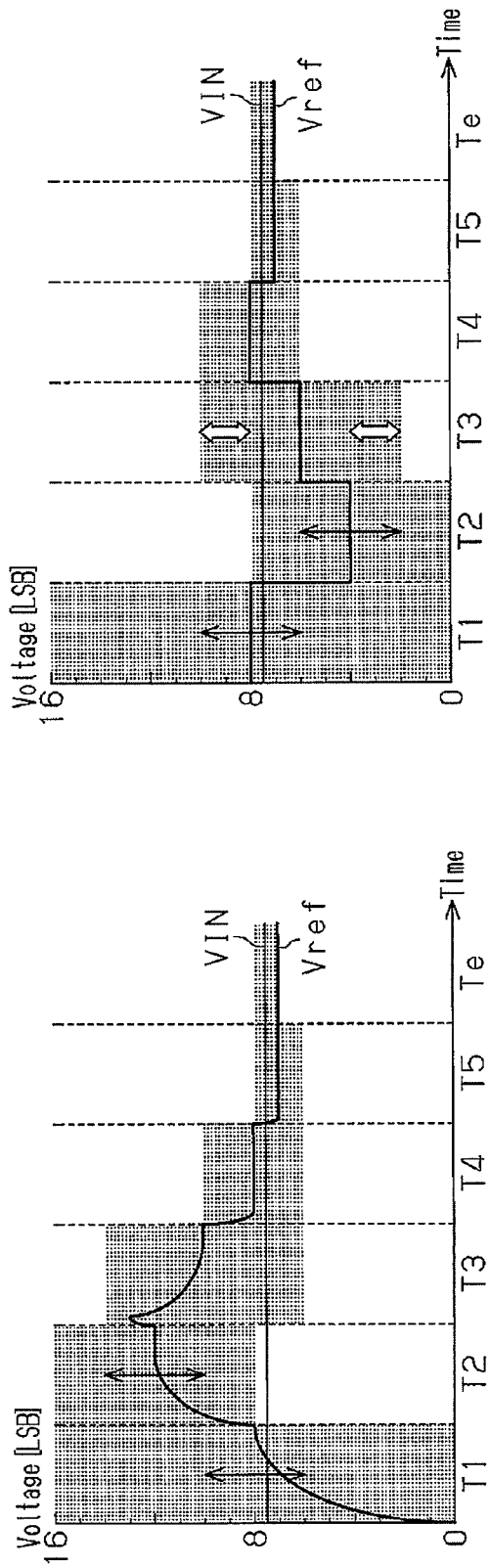

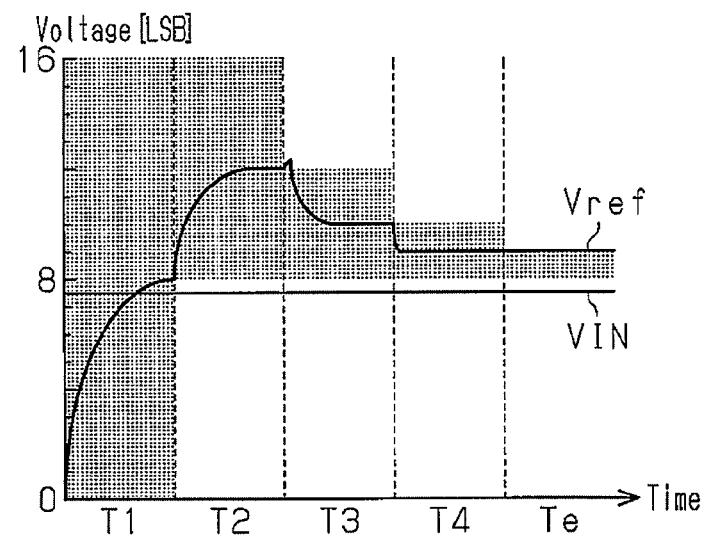

Fig.15

| Step | Comparison Reference Signal | Redundancy |
|---|---|---|
| 1st Comparison | 8LSB | ±2LSB |
| 2nd Comparison | Add "+3LSB" to the previous value when the previous comparison result is "H" | ±1LSB |
| | Add "-3LSB" to the previous value when the previous comparison result is "L" | |
| 3rd Comparison | Add "+2LSB" to the previous value when the previous comparison result is "H" | ±1LSB |
| | Add "-2LSB" to the previous value when the previous comparison result is "L" | |
| 4th Comparison | Add "+1LSB" to the previous value when the previous comparison result is "H" | None |
| | Add "-1LSB" to the previous value when the previous comparison result is "L" | |
| 5th Comparison | Add "+1LSB" to the previous value when the previous comparison result is "H" | None |
| | Add "-1LSB" to the previous value when the previous comparison result is "L" | |

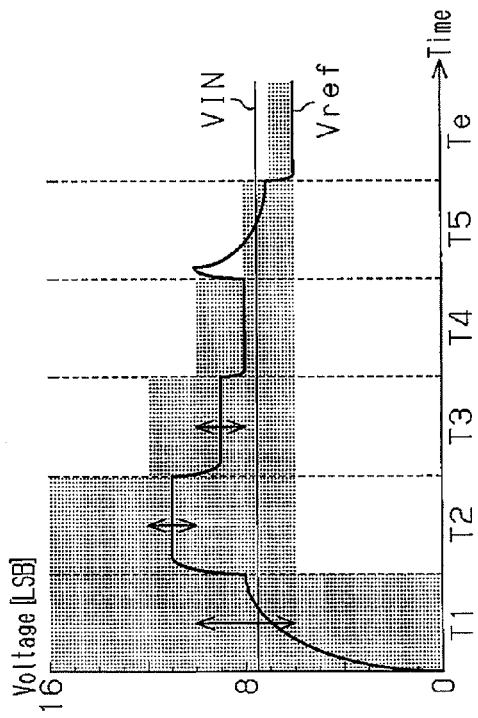

ANALOG-DIGITAL CONVERSION CIRCUIT AND METHOD

CROSS-REFERENCE TO RELATED APPLICATIONS

This application is based upon and claims the benefit of priority from prior Japanese Patent Application No. 2013-001889, filed on Jan. 9, 2013, the entire contents of which are incorporated herein by reference.

FIELD

This disclosure relates to an analog-digital conversion circuit and an analog-digital conversion method.

BACKGROUND

An analog-digital (A/D) conversion circuit for converting an analog input signal into a digital output signal has been used in various fields. For example, microcomputers and system LSIs include a successive-approximation type A/D conversion circuit. The successive-approximation type A/D conversion circuit samples an analog input signal and compares the analog input signal with a comparison voltage acquired from an output signal of a digital-analog converter (D/A converter). The successive-approximation type A/D conversion circuit repeats the operation from high-order bits to low-order bits of the digital output signal to determine a value of each bit of the digital output signal. Japanese Laid-Open Patent Publication No. 2010-16466 and Japanese Laid-Open Patent Publication No. 2003-283336 describe the configuration of such successive-approximation type A/D conversion circuits.

In the successive-approximation type A/D conversion circuit, each time A/D conversion of each bit is performed, a capacitor is charged or discharged by the output signal of the D/A converter. This changes the comparison voltage. Thus, the output signal of the D/A converter, which charges or discharges the capacitor, changes depending on a comparison result of a previous bit. Time required to charge or discharge the capacitor is affected by speed-up of A/D conversion. However, when a period of a charging and discharging cycle decreases due to speed-up of A/D conversion, the capacitor may not be sufficiently charged or discharged. This results in a difference between a voltage corresponding to the comparison result of the previous bit and the comparison voltage acquired through charging or discharging of the capacitor. Such a voltage difference may cause erroneous determination in the comparison operation of a next bit and decrease the accuracy of the digital output signal.

SUMMARY

One aspect of this disclosure is an analog-digital conversion circuit that converts an analog input signal into a digital output signal. The analog-digital conversion circuit includes a comparator including a first input terminal that receives the analog input signal. A controller is configured to generate a first signal and a second signal in accordance with an output signal from the comparator. A first digital-analog converter is configured to generate a first reference signal based on the first signal. A second digital-analog converter is configured to generate a second reference signal based on the second signal. A first capacitive element includes a first terminal that receives the first reference signal and a second terminal coupled to a second input terminal of the comparator. A second capacitive element includes a first terminal that receives the second reference signal and a second terminal coupled to the second input terminal of the comparator. A correction circuit is configured to correct the first signal and the second signal to generate the digital output signal. The first signal is an N1-bit digital signal. The second signal is an N2B-bit digital signal acquired by adding a Kbit correction signal to an N2A-bit signal. The controller is configured to sequentially set bit values of the first signal and bit values of the second signal in accordance with the output signal of the comparator. The correction circuit is configured to generate the digital output signal of (N1+N2A) bits based on a sum of a value acquired by multiplying the N1-bit digital signal generated by the controller by $2^{N2A}$ and a value of the N2B-bit digital signal generated by the controller.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The embodiment, together with objects and advantages thereof, may best be understood by reference to the following description of the presently preferred embodiments together with the accompanying drawings in which:

FIG. 2 is a view illustrating the operation of the analog-digital conversion circuit in FIG. 1;

FIG. 6 is a view illustrating the operation of a correction circuit in FIG. 4;

FIGS. 8A, 8B, 9A, and 9B are views illustrating the operation of the analog-digital conversion circuit;

FIGS. 14A and 14B are views illustrating the operation of the analog-digital conversion circuit in FIG. 13;

FIG. 15 is a view illustrating the operation of the analog-digital conversion circuit in FIG. 13; and FIGS. 16A and 16B are views illustrating the operation of the analog-digital conversion circuit in FIG. 13.

DESCRIPTION OF THE EMBODIMENTS

One embodiment will now be described below.

Figure 1:
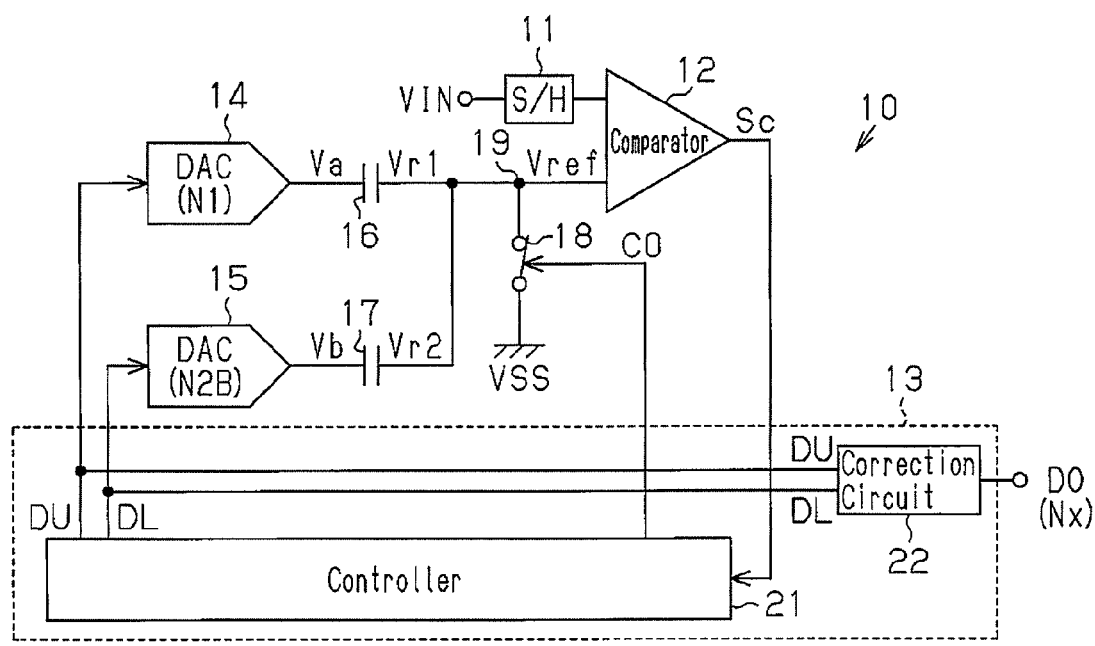
FIG. 1 is a schematic block circuit diagram illustrating an analog-digital conversion circuit.

As illustrated in FIG. 1, a successive-approximation type analog-digital conversion circuit 10 (hereinafter referred to as merely A/D conversion circuit 10) converts an analog input signal VIN into a digital output signal DO.

The A/D conversion circuit 10 includes a sample-hold circuit 11, a comparator 12, a successive-approximation controller 13, digital-analog converters 14 and 15 (hereinafter referred to as first and second D/A converters 14 and 15), capacitors 16 and 17, and a switch 18. In this embodiment, the successive-approximation controller 13 is a successive-approximation register (SAR) logic circuit (hereinafter referred to as SAR logic circuit 13). Each of the D/A converters 14 and 15 is represented as "DAC" in FIG. 1.

The sample-hold circuit 11 includes, for example, switches and capacitors. The sample-hold circuit 11 samples the analog input signal VIN and holds a sampling value. The sampling value held by the sample-hold circuit 11 is supplied to the comparator 12. Since the sampling value represents the analog input signal VIN held by the sample-hold circuit 11, the sampling value supplied to the comparator 12 is hereafter regarded as the analog input signal VIN.

The comparator 12 includes a first terminal for receiving the analog input signal VIN and a second terminal for receiving a comparison reference signal Vref, and generates a comparison signal Sc representing a result of comparison between the analog input signal VIN and the comparison reference signal Vref. For example, when the analog input signal VIN is higher than the comparison reference signal Vref, the comparator 12 generates the comparison signal Sc of a first level (e.g., H level). When the analog input signal VIN is lower than the comparison reference signal Vref, the comparator 12 generates the comparison signal Sc of a second level (e.g., L level).

The SAR logic circuit 13 generates a first control signal DU for the first D/A converter 14 and a second control signal DL for the second D/A converter 15. The first control signal DU is one example of a first signal, and the second control signal DL is one example of a second signal. Based on the comparison signal Sc of the comparator 12, the SAR logic circuit 13 sequentially sets the values of a plurality of bits of the first control signal DU and the values of a plurality of bits of the second control signal DL.

The first D/A converter 14 is a multi-bit D/A converter including, for example, ladder resistors. The first D/A converter 14 generates an output signal Va having a voltage value corresponding to the bits of the first control signal DU.

The second D/A converter 15 is a multi-bit D/A converter including, for example, ladder resistors. The second D/A converter 15 generates an output signal Vb having a voltage value corresponding to the bits of the second control signal DL. The number of bits of the first D/A converter 14 and the number of bits of the second D/A converter 15 are set according to the number of bits of the digital output signal DO and the number of bits of a correction signal.

Given that the number of bits of the digital output signal DO is "Nx", the number of high-order bits of the digital output signal DO is "N1", and the number of low-order bits of the digital output signal DO is "N2A", the number of bits Nx of the digital output signal DO is acquired as a sum of the number of high-order bits N1 and the number of low-order bits N2A (i.e., Nx=N1+N2A). In this embodiment, the number of bits of the first D/A converter 14, that is, the number of bits of the first control signal DU is set to the number of high-order bits "N1" of the digital output signal DO. The number of bits of the correction signal is represented as "K". In this embodiment, the number of bits of the second D/A converter 15, that is, the number of bits of the second control signal DL is set to a sum "N2A+K" of the number of low-order bits N2A and the number of bits K of the correction signal. In the following description, the number of bits of the first D/A converter 14 is referred to as "N1", and the number of bits of the second D/A converter 15 is referred to as "N2B" (=N2A+K).

Further, in the following description, the first D/A converter 14 may be referred to as high-order DAC, and the second D/A converter 15 may be referred to as low-order DAC. The first control signal DU may be referred to as high-order DAC code, and the second control signal DL may be referred to as low-order DAC code.

The first D/A converter 14 includes $2^{\wedge}N1$ resistors corresponding to the number of bits N1 as the ladder resistors. The symbol "^" represents an operator for power. The first D/A converter 14 divides a potential difference between a high potential-side reference voltage VRH and a low potential-side reference voltage VRL to generate a plurality of divided voltages, selects one of the divided voltages according to the first control signal DU, and generates the output signal Va having a value of the selected divided voltage. Similarly, the second D/A converter 15 includes $2^{\wedge}N2B$ resistors corresponding to the number of bits N2B as the ladder resistors. The second D/A converter 15 divides the potential difference between the reference voltage VRH and the reference voltage VRL to generate a plurality of divided voltages, selects one of the divided voltages according to the second control signal DL, and generates the output signal Vb having a value of the selected divided voltage. The reference voltages VRH and VRL are set according to voltages in a full scale range (hereinafter referred to as FSR) of the analog input signal VIN.

An output terminal of the first D/A converter 14 is coupled to a first terminal of the first capacitor 16. A second terminal of the first capacitor 16 is coupled to the second terminal of the comparator 12. An output terminal of the second D/A converter 15 is coupled to a first terminal of the second capacitor 17. A second terminal of the second capacitor 17 is coupled to the second terminal of the comparator 12. That is, the output terminal of the first D/A converter 14 and the output terminal of the second D/A converter 15 are capacitively coupled to the second terminal of the comparator 12 by the first capacitor 16 and the second capacitor 17.

A first reference signal Vr1 is generated at the second terminal of the first capacitor 16. The first reference signal Vr1 has a voltage corresponding to a capacitance value C1 of the first capacitor 16 and a voltage value of the output signal Va of the first D/A converter 14. A second reference signal Vr2 is generated at the second terminal of the second capacitor 17. The second reference signal Vr2 has a voltage based on a capacitance value C2 of the second capacitor 17 and the voltage value of the output signal Vb of the second D/A converter 15. Consequently, the comparison reference signal Vref acquired by combining the first reference signal Vr1 and the second reference signal Vr2 is supplied to the second terminal of the comparator 12.

The capacitance value C1 of the first capacitor 16 and the capacitance value C2 of the second capacitor 17 are set according to the number of bits "Nx" of the digital output signal DO and the number of bits "K" of the correction signal. The capacitance value C1 of the first capacitor 16 is set according to the number of low-order bits "N2A" (=Nx-N1) of the digital output signal DO. For example, the capacitance value C1 is set to a value ($C*2^{\wedge}N2A$) acquired by multiplying the unit capacitance value C by $2^{\wedge}N2A$. The symbol "*" represents multiplication. That is, the capacitance value C1 is set to a ratio of the power of 2 using the number of low-order bits N2A of the digital output signal DO as an exponent. The capacitance value C2 of the second capacitor 17 is set according to the number of bits "K" of the correction signal. For example, the capacitance value C2 of the second capacitor 17 is set to a value (C*2^K) acquired by multiplying the unit capacitance value C by 2^K. That is, the capacitance value C2 is set to a ratio of the power of 2 using the number of bits K of the correction signal as an exponent.

The setting of the capacitance values C1 and C2 described above makes the amount of change of 1 LSB (Least Significant Bit) of the reference signals Vr1 and Vr2 equal. The amount of change of 1 LSB corresponds to the amount of change of the analog input signal VIN at the time when the value of the least significant bit (LSB) of the digital output signal DO changes. Hereinafter, the amount of signal (for example, voltage value) corresponding to 1 LSB is regarded as merely 1 LSB.

For example, the number of bits of the first D/A converter 14 is set to "2" (N1=2), the number of bits of the second D/A converter 15 is set to "3" (N2B=3, N2A=2, K=1), and the number of bits of the digital output signal DO is set to "4" (Nx=4). In this case, FSR of the analog input signal VIN is expressed as 16 (that is, 2^4) LSB. The first D/A converter 14 includes 2^2 resistance elements that are serially-coupled. The second D/A converter 15 includes 2^3 resistance elements that are serially-coupled. The first D/A converter 14 and the first capacitor 16 generate the first reference signal Vr1 in the range of 16 LSB (0, 4, 8, 12 LSB) according to the number of bits "4" of the digital output signal DO. The second D/A converter 15 and the second capacitor 17 generate the second reference signal Vr2 in the range of 8 LSB (0 LSB to 7 LSB) according to the number of bits "3".

That is, the first D/A converter 14 and the first capacitor 16 generate the first reference signal Vr1 weighted according to the high-order bits (N1 bits) of the Nx-bit digital output signal DO. The second D/A converter 15 and the second capacitor 17 generate the second reference signal Vr2 weighted according to the low-order bits (N2A bits) of the Nx-bit digital output signal DO. The second D/A converter 15 and the second capacitor 17 change the second reference signal Vr2 by the larger amount of change than the amount of change of the first reference signal Vr1 according to change in the least significant bit of the N1-bit first control signal DU.

For example, the first D/A converter 14 includes four (that is, 2^2) serially-coupled resistance elements according to the number of bits "2" (N1). The second D/A converter 15 includes eight (that is, 2^3) serially-coupled resistance elements according to the number of bits "3" (N2A). The reference voltages VRH and VRL are supplied to the first D/A converter 14 and the second D/A converter 15. A resistance value of each of the resistance elements of the first D/A converter 14 is set to be equal to a resistance value of each of the resistance elements of the second D/A converter 15. This simplifies formation of the resistance elements of the first D/A converter 14 and the resistance elements of the second D/A converter 15.

In the first D/A converter 14 and second D/A converter 15 described above, when the least significant bit of the second control signal DL changes (for example, "0" to "1"), the amount of change of the output signal Vb is a half of the amount of change of the output signal Va at the time when the least significant bit of the first control signal DU changes. Thus, the capacitance value C1 of the first capacitor 16 coupled to the first D/A converter 14 is set to be 2^2 times of the unit capacitance value C, and the capacitance value C2 of the second capacitor 17 coupled to the second D/A converter 15 is set to be 2^1 times of the unit capacitance value C. As a result, the first reference signal Vr1 in the range of 16 LSB (0, 4, 8, 12 LSB) is generated based on the output signal Va of the first D/A converter 14 that serves as the high-order DAC, and the second reference signal Vr2 in the range of 8 LSB (0 to 7 LSB) is generated based on the output signal Vb of the second D/A converter 15 that serves as the low-order DAC.

A first terminal of the switch 18 is coupled to a node 19 between the comparator 12 and the capacitors 16 and 17. A second terminal of the switch 18 is coupled to a wiring to which a low-potential power voltage VSS is supplied. The low-potential power voltage VSS is, for example, 0[V]. The low-potential power voltage VSS is one example of a reference voltage. The switch 18 is turned on/off according to a control signal C0 generated by the SAR logic circuit 13. When the switch 18 is turned on, the potential of the node 19 is set to be equal to the low-potential power voltage VSS. That is, the turned-on switch 18 resets the node 19 to the level of a given potential (low-potential power voltage VSS). A combination of the capacitors 16 and 17 and the switch 18 is one example of a signal generation circuit.

The SAR logic circuit 13 includes a controller 21 and a correction circuit 22. The controller 21 generates the first control signal DU for the first D/A converter 14 (high-order DAC), the second control signal DL for the second D/A converter 15 (low-order DAC), and the control signal C0 for controlling the switch 18.

First, the controller 21 sets an initial value of the first control signal DU and an initial value of the second control signal DL. Subsequently, the controller 21 performs binary search of the first D/A converter 14, and then sets the bit values of the first control signal DU from the initial value. After binary search of the first D/A converter 14, the controller 21 performs binary search of the second D/A converter 15, and then sets the bit values of the second control signal DL from the initial value.

The controller 21 initializes the capacitors 16 and 17 together with the D/A converters 14 and 15. In initialization, the controller 21 sets respective initial values of the control signals DU and DL, and turns on the switch 18. For example, an initial value I1 of the first control signal DU is set to "0". An initial value I2 of the second control signal DL is set to "2^(N2B−1)−2^(Nx−N1−1)". "Nx−N1" represents the number of low-order bits N2A of the digital output signal DO. Consequently, the initial value I2 is expressed as "2^(N2B−1)−2^(N2A−1)". The value of "2^(N2B−1)" corresponds to ½ of the changeable range of the second reference signal Vr2 according to the second control signal DL. The value of "2^(N2A−1)" falls within the range according to the number of low-order bits N2A of the digital output signal DO, and corresponds to ½ of the amount of change in one step of the first reference signal Vr1. Consequently, the initial value I2 corresponds to ½ of a difference between the changeable range of the second reference signal Vr2 and the amount of change in one step of the first reference signal Vr1.

The D/A converters 14 and 15 generate the output signals Va and Vb, respectively, according to the initial values of the control signals DU and DL. The turned-on switch 18 resets the potential of the node 19, that is, the second terminals (electrodes) of the capacitors 16 and 17 to the level of the low-potential power voltage VSS. The low-potential power voltage VSS is, for example, 0[V]. Consequently, an electrical charge corresponding to the initial value of the control signal DU and the capacitance value C1 is accumulated in the capacitor 16. Similarly, an electrical charge corresponding to the initial value of the control signal DL and the capacitance value C2 is accumulated in the capacitor 17. The electrical charge accumulated in the capacitor 16 and the electrical charge accumulated in the capacitor 17 offset the reference signals Vr1 and Vr2, that is, the comparison reference signal Vref with respect to the output signals Va and Vb, respectively, in a given direction (for example, to a negative voltage side). That is, the controller 21 initializes the D/A converters 14 and 15 and the capacitors 16 and 17, generating the comparison reference signal Vref offset with respect to the control signals DU and DL.

The correction circuit 22 generates the digital output signal DO based on the first and second control signals DU and DL generated through successive approximation. The number of bits of the first control signal DU is "N1", and the number of bits of the second control signal DL is "N2B" (=N2A+K). The number of bits of the digital output signal DO is "Nx" (=N1+N2A). The correction circuit 22 corrects the first and second control signals DU and DL of (Nx+K) bits, thereby generating the Nx-bit digital output signal DO.

Correction of the control signals DU and DL, that is, generation of the digital output signal DO is performed according to a following equation, for example.

$$DO=DU \times 2^{(Nx-N1)}+DL-I2$$

Where, "DU" represents a value of the control signal DU, and "DL" represents a value of the control signal DL. I2" represents the initial value I2 ($=2^{(N2B-1)}-2^{(Nx-N1-1)}$) of the second control signal DL (low-order DAC code). The exponent "Nx−N1" corresponds to the number of low-order bits N2A of the digital output signal DO.

Next, conversion processing of the A/D conversion circuit 10 will now be described. Since the SAR logic circuit 13 includes the controller 21 and the correction circuit 22, processing in the controller 21 and the correction circuit 22 will now be described as processing in the SAR logic circuit 13.

First, summary of the conversion processing will now be described. In initialization step T0, the controller 21 initializes the D/A converters 14 and 15 and the capacitors 16 and 17. Next, the controller 21 repeats the comparison step N1 times to set the bit values of the first control signal DU for the first D/A converter 14 through binary search. Next, the controller 21 repeats the comparison step N2B times to set the bit values of the second control signal DL for the second D/A converter 15 through binary search. That is, the controller 21 performs comparison steps T1 to T(N1+N2B), and sequentially sets the bit values of the first control signal DU and the bit values of the second control signal DL. Next, in comparison end step Te, the controller 21 sets the least significant bit of the low-order DAC code. Next, in output step To, the controller 21 generates the digital output signal DO based on the first control signal DU and the second control signal DL.

Figure 10:
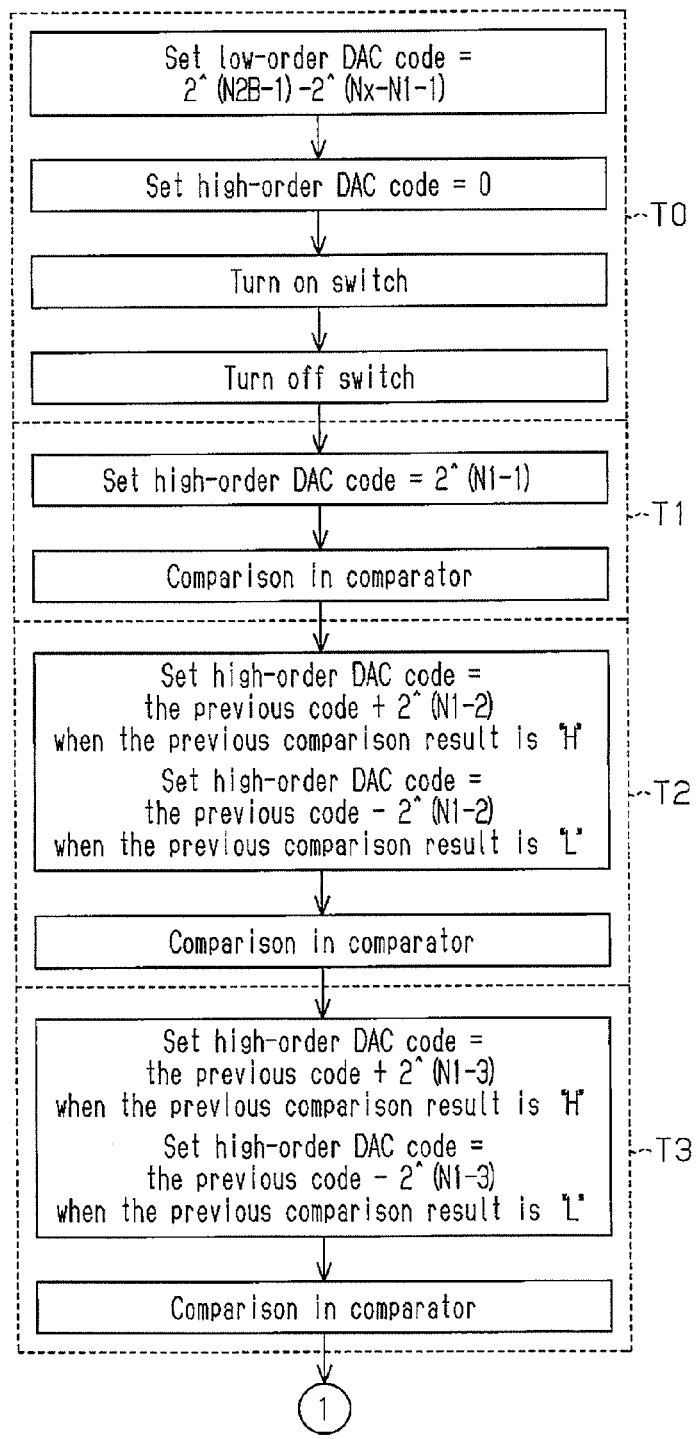
FIGS. 10, 11, and 12 are a schematic flow chart illustrating analog-digital conversion processing.

As illustrated in FIG. 10, first, in Initialization step T0, the controller 21 sets the initial value I2 ($=2^{(N2B-1)}-2^{(Nx-N1-1)}$) to the low-order DAC code (second control signal DL), and sets the initial value I1 (=0) to the high-order DAC code (first control signal DU). Further, the controller 21 turns on the switch 18 illustrated in FIG. 1 and then turns off the switch 18.

In the first comparison (comparison step T1), the controller 21 updates the high-order DAC code (first control signal DU) from the initial value I2. For example, the controller 21 sets "$2^{(N1-1)}$" to the high-order DAC code. That is, the most significant bit of the high-order DAC code is set to "1". The comparison reference signal Vref responsive to updating of the high-order DAC code is supplied to the comparator 12. The comparator 12 compares the analog input signal VIN with the comparison reference signal Vref, and generates the comparison signal Sc indicating the comparison result.

In the second comparison (comparison step T2), the controller 21 updates the high-order DAC code according to the previous comparison result. For example, when the previous comparison signal Sc is at "H" level (VIN>Vref), the controller 21 sets the high-order DAC code to a value derived by adding "$2^{(N1-2)}$" to the previous high-order DAC code. When the previous comparison signal Sc is at "L" level (VIN<Vref), the controller 21 sets the high-order DAC code to a value derived by subtracting "$2^{(N1-2)}$" from the previous high-order DAC code. The comparison reference signal Vref responsive to updating of the high-order DAC code is supplied to the comparator 12. The comparator 12 compares the analog input signal VIN with the comparison reference signal Vref, and generates the comparison signal Sc indicating the comparison result.

In the third comparison (comparison step T3), the controller 21 updates the high-order DAC code according to the previous comparison result. For example, when the previous comparison signal Sc is at "H" level (VIN>Vref), the controller 21 sets the high-order DAC code to a value derived by adding "$2^{(N1-3)}$" to the previous high-order DAC code. When the previous comparison signal Sc is at "L" level (VIN<Vref), the controller 21 sets the high-order DAC code to a value derived by subtracting "$2^{(N1-3)}$" from the previous high-order DAC code. The comparison reference signal Vref responsive to updating of the high-order DAC code is supplied to the comparator 12. The comparator 12 compares the analog input signal VIN with the comparison reference signal Vref, and generates the comparison signal Sc indicating the comparison result.

Figure 11:
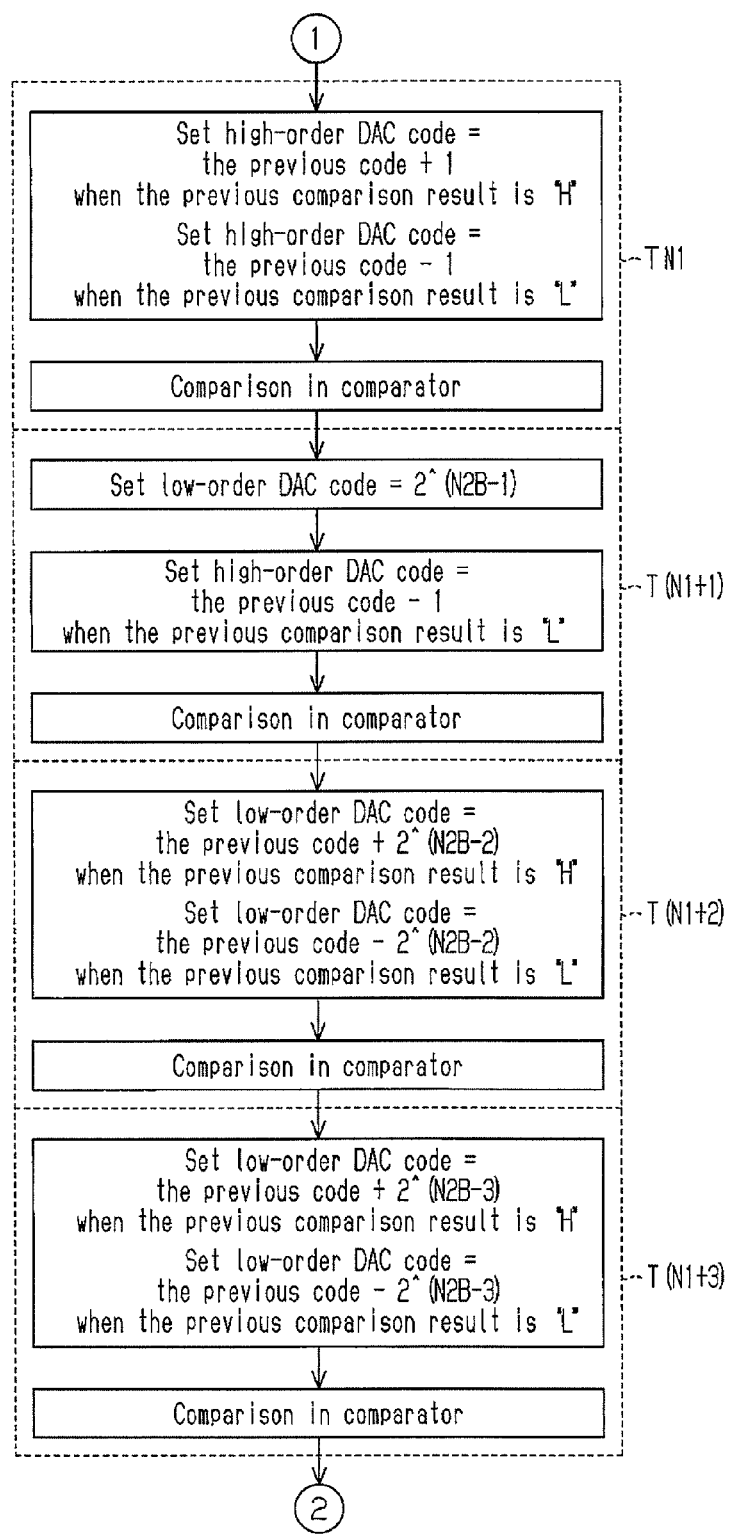

Next, as illustrated in FIG. 11, in the (N1)th comparison (comparison step TN1), the controller 21 updates the high-order DAC code according to the previous comparison result. Processing from the fourth comparison to the (N1-1)th comparison is the same as processing of the third comparison and thus, figure and description thereof is omitted. In comparison step TN1, when the previous comparison signal Sc is at "H" level (VIN>Vref), the controller 21 sets the high-order DAC code to a value derived by adding 1 to the previous high-order DAC code. When the previous comparison signal Sc is at "L" level (VIN<Vref), the controller 21 sets the high-order DAC code to a value derived by subtracting 1 from the previous high-order DAC code. The comparison reference signal Vref responsive to updating of the high-order DAC code is supplied to the comparator 12. The comparator 12 compares the analog input signal VIN with the comparison reference signal Vref, and generates the comparison signal Sc indicating the comparison result.

In the (N1+1)th comparison (comparison step T(N1+1)), the controller 21 updates the low-order DAC code (second control signal DL), and updates the high-order DAC code according to the previous comparison result. For example, the controller 21 sets "$2^{(N2B-1)}$" to the low-order DAC code. That is, the most significant bit of the low-order DAC code is set to "1". When the previous comparison signal Sc is at "L" level, the controller 21 sets the high-order DAC code to a value derived by subtracting 1 from the previous high-order DAC code. The comparison reference signal Vref responsive to updating of the high-order DAC code and updating of the low-order DAC code is supplied to the comparator 12. The comparator 12 compares the analog input signal VIN with the comparison reference signal Vref, and generates the comparison signal Sc indicating the comparison result.

In the (N1+2)th comparison (comparison step T(N1+2)), controller 21 updates the low-order DAC code according to the previous comparison result. For example, when the previous comparison signal Sc is at "H" level, the controller 21 sets the low-order DAC code to a value derived by adding "$2^{(N2B-2)}$" to the previous low-order DAC code. When the previous comparison signal Sc is at "L" level, the controller 21 sets the low-order DAC code to a value derived by subtracting "2^(N2B−2)" from the previous low-order DAC code. The comparison reference signal Vref responsive to updating of the low-order DAC code is supplied to the comparator 12. The comparator 12 compares the analog input signal VIN with the comparison reference signal Vref, and generates the comparison signal Sc indicating the comparison result.

In the (N1+3)th comparison (comparison step T(N1+3)), controller 21 updates the low-order DAC code according to the previous comparison result. For example, when the previous comparison signal Sc is at "H" level, the controller 21 sets the low-order DAC code to a value derived by adding "2^(N2B−3)" to the previous low-order DAC code. When the previous comparison signal Sc is at "L" level, the controller 21 sets the low-order DAC code to a value derived by subtracting "2^(N2B−3)" from the previous low-order DAC code. The comparison reference signal Vref responsive to updating of the low-order DAC code is supplied to the comparator 12. The comparator 12 compares the analog input signal VIN with the comparison reference signal Vref, and generates the comparison signal Sc indicating the comparison result.

Figure 12:
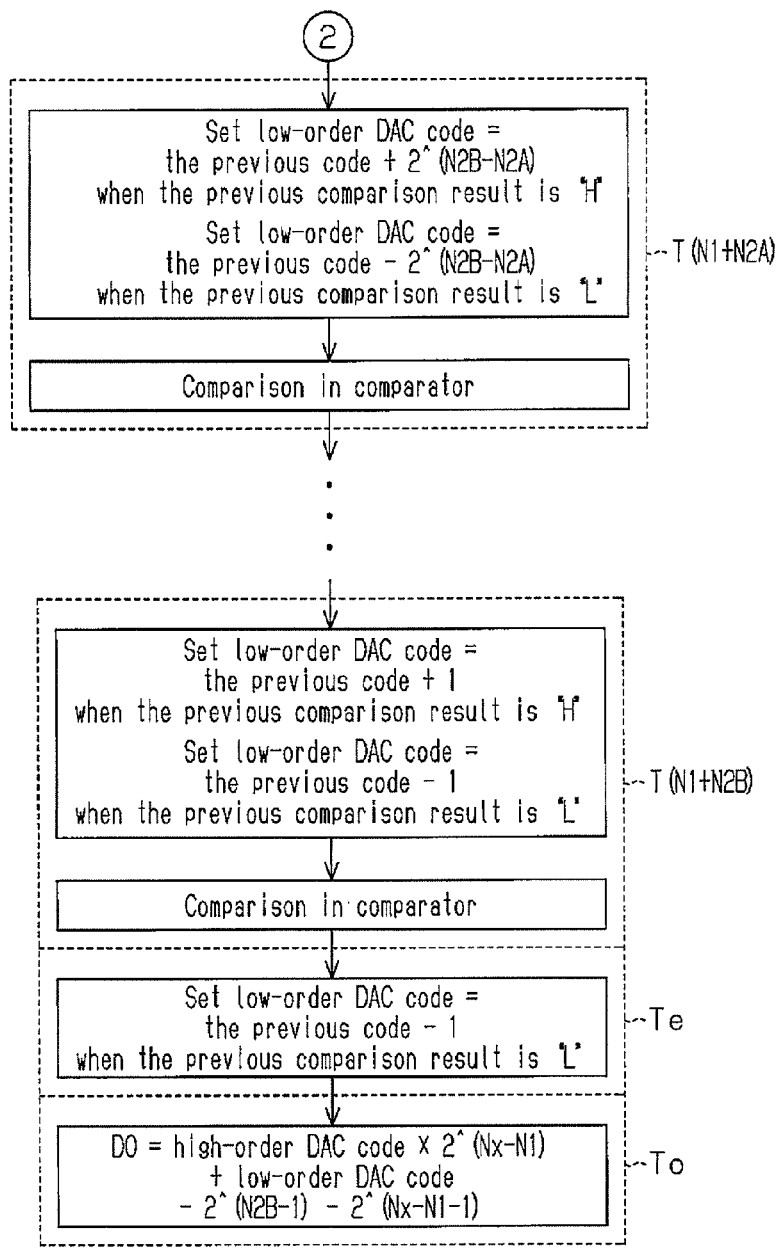

Next, as illustrated in FIG. 12, in the (N1+N2A)th comparison (comparison step T(N1+N2A)), the controller 21 updates the low-order DAC code according to the previous comparison result. Processing from the (N1+4)th comparison to the (N1+N2A−1)th comparison is the same as processing of the (N+3)th comparison and thus, figure and description thereof is omitted. In comparison step T(N1+N2A), when the previous comparison signal Sc is at "H" level, the controller 21 sets the low-order DAC code to a value derived by adding "2^(N2B−N2A)" to the previous low-order DAC code. When the previous comparison signal Sc is at "L" level, the controller 21 sets the low-order DAC code to a value derived by subtracting "2^(N2B−N2A)" from the previous low-order DAC code. The comparison reference signal Vref responsive to updating of the low-order DAC code is supplied to the comparator 12. The comparator 12 compares the analog input signal VIN with the comparison reference signal Vref, and generates the comparison signal Sc indicating the comparison result.

Processing from the (N1+N2A+1)th comparison to the (N1+N2B−1)th comparison is the same as processing of (N1+N2A)th comparison and thus, figure and description thereof is omitted.

In the (N1+N2B)th comparison (comparison step T(N1+N2B)), the controller 21 updates the low-order DAC code according to the previous comparison result. For example, when the previous comparison signal Sc is at "H" level, the controller 21 sets the low-order DAC code to a value derived by adding 1 to the previous low-order DAC code. When the previous comparison signal Sc is at "L" level, the controller 21 sets the low-order DAC code to a value derived by subtracting 1 from the previous low-order DAC code. The comparison reference signal Vref responsive to updating of the low-order DAC code is supplied to the comparator 12. The comparator 12 compares the analog input signal VIN with the comparison reference signal Vref, and generates the comparison signal Sc indicating the comparison result.

Next, in comparison result step Te, the controller 21 updates the low-order DAC code according to the previous comparison result. For example, when the previous comparison signal Sc is at "L" level, the controller 21 sets the low-order DAC code to a value derived by subtracting 1 from the previous low-order DAC code.

Next, in output step To, the correction circuit 22 corrects the high-order DAC code and the low-order DAC code to generate the digital output signal DO. For example, the correction circuit 22 generates the digital output signal DO according to the following expression.

high-order $DAC$ code×$2^{(Nx-N1)}$+
low-order $DAC$ code−$2^{(N2B-1)}$−$2^{(Nx-N1-1)}$ Next, details of the A/D conversion circuit 10 will now be described with reference to FIGS. 3 and 4. For convenience of understanding, the A/D conversion circuit 10 for generating 4-bit (Nx=4) digital output signal DO will be described. In the following description, it is assumed that the number of high-order bits N1 of the digital output signal DO is "2", the number of low-order bits N2A of the digital output signal DO is "2", and the number of bits K of the correction signal is "1".

Figure 3:
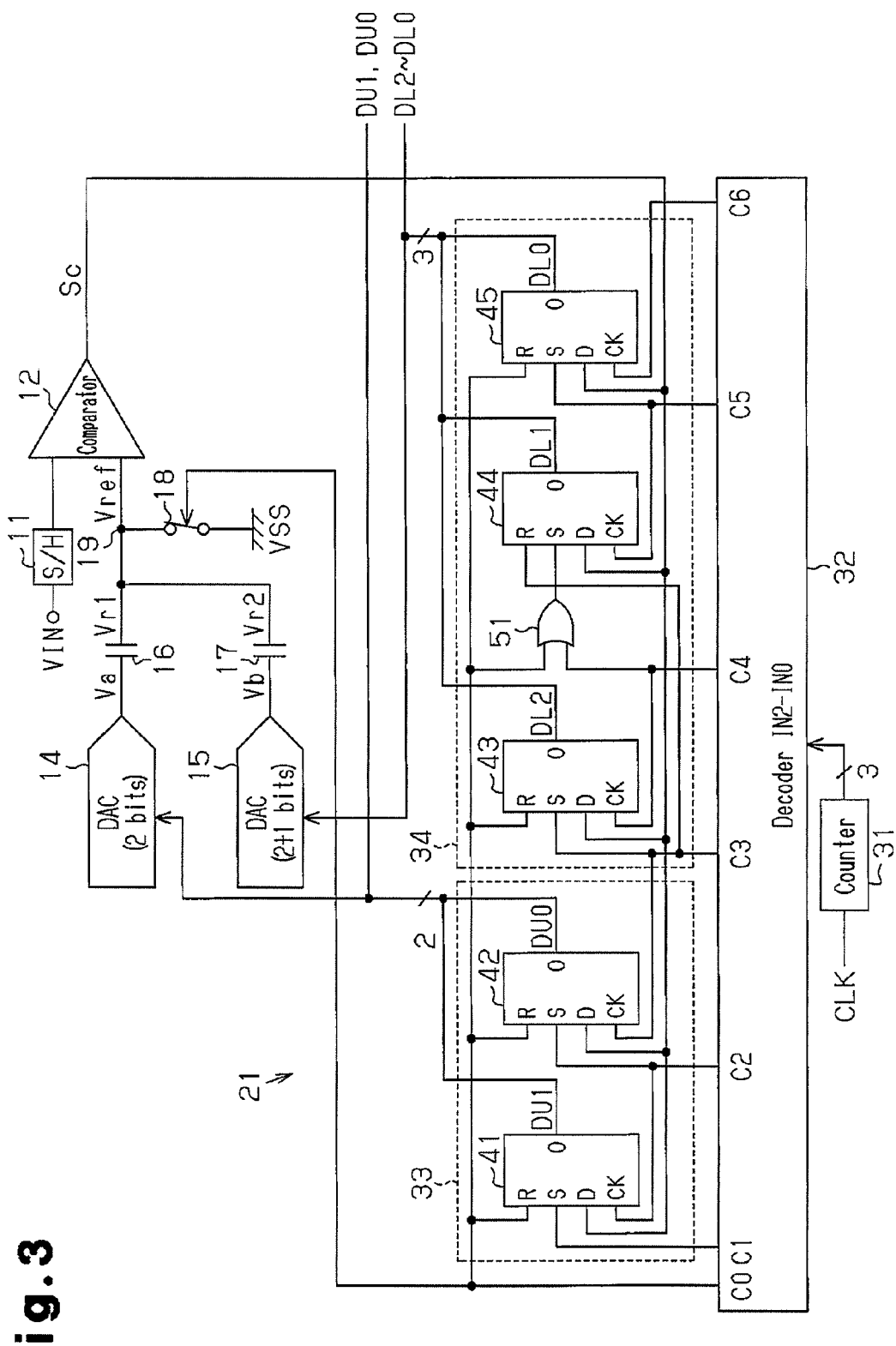
FIG. 3 is a schematic block circuit diagram of a controller in FIG. 1.

As illustrated in FIG. 3, the first D/A converter 14 generates the output signal Va corresponding to the 2-bit (N1=2) first control signal DU. The second D/A converter 15 generates the output signal Vb corresponding to the 3-bit (N2B=N2A+K=2+1=3) second control signal DL.

The controller 21 includes a counter 31, a decoder 32, and setting registers 33 and 34. The counter 31 counts a clock signal CLK, and generates a given number of bits (for example, 3 bits) of input signals IN2 to IN0. The number of bits of the input signals IN2 to IN0 is set according to the number of bits of the first D/A converter 14 and the number of bits of the second D/A converter 15. The A/D conversion circuit 10 performs the initialization step and then, repeats the comparison step a number of times corresponding to a sum "5" (=2+3) of the number of bits "2" of the first D/A converter 14 and the number of bits "3" of the second D/A converter 15, thereby generating the digital output signal DO based on the first control signal DU and the second control signal DL. Thus, the number of bits of the input signals IN2 to IN0 is set according to the number of steps to be performed to generate the digital output signal DO.

The decoder 32 decodes the input signals IN2 to IN0 to generate control signals C0 to C6. FIG. 5 illustrates association between the input signals IN2 to IN0 and the control signals C0 to C6.

The switch 18 is turned on according to the control signal C0 of H level (logical value "1"), and is turned off according to the control signal C0 of L level (logical value "0"). For example, the sample-hold circuit 11 samples the analog input signal VIN when the control signal C0 is at H level, and holds the sampling signal (sampled analog input signal VIN) when the control signal C0 is at L level.

The first setting register 33 generates the first control signal DU for the first D/A converter 14. The second setting register 34 generates the second control signal DL for the second D/A converter 15. The first control signal DU is a 2-bit (N1=2) signal, and includes a control signal DU1 as a first bit, that is, the most significant bit (msb) and a control signal DU0 as a second bit (2sb). The second control signal DL is a 3-bit (N2A+K=2+1) signal, and includes a control signal DL2 as a first bit, that is, the most significant bit (msb), a control signal DL1 as a second bit (2sb), and a control signal DL0 as a third bit (3sb).

The setting register 33 includes two flip-flop circuits (hereinafter referred to as FF circuit) 41 and 42 corresponding to the 2-bit first control signal DU (DU1, DU0). The FF circuit 41 includes a reset terminal R for receiving the control signal C0, a set terminal S for receiving the control signal C1, a data terminal D for receiving the comparison signal Sc, a clock terminal CK for receiving the control signal C2, and an output terminal O for outputting the control signal DU1. The FF circuit 42 includes a reset terminal R for receiving the control signal C0, a set terminal S for receiving the control signal C2, a data terminal D for receiving the comparison signal Sc, a clock terminal CK for receiving the control signal C3, and an output terminal O for outputting the control signal DU0.

The setting register 34 includes three flip-flop circuits (hereinafter referred to as FF circuit) 43 to 45 corresponding to the 3-bit second control signal DL (DL2 to DL0) and a logical OR circuit (OR circuit) 51. The FF circuit 43 includes a reset terminal R for receiving the control signal C0, a set terminal S for receiving the control signal C3, a data terminal D for receiving the comparison signal Sc, a clock terminal CK for receiving the control signal C4, and an output terminal O for outputting the control signal DL2.

The control signals C0 and C4 are supplied to the OR circuit 51. An output terminal of the OR circuit 51 is coupled to a set terminal S of the FF circuit 44. The FF circuit 44 includes a reset terminal R for receiving the control signal C3, a data terminal D for receiving the comparison signal Sc, a clock terminal CK for receiving the control signal C5, and an output terminal O for outputting the control signal DL1. The FF circuit 45 includes a reset terminal R for receiving the control signal C0, a set terminal S for receiving the control signal C5, a data terminal D for receiving the comparison signal Sc, a clock terminal CK for receiving the control signal C6, and an output terminal O for outputting the control signal DL0.

Figures 4, 5:
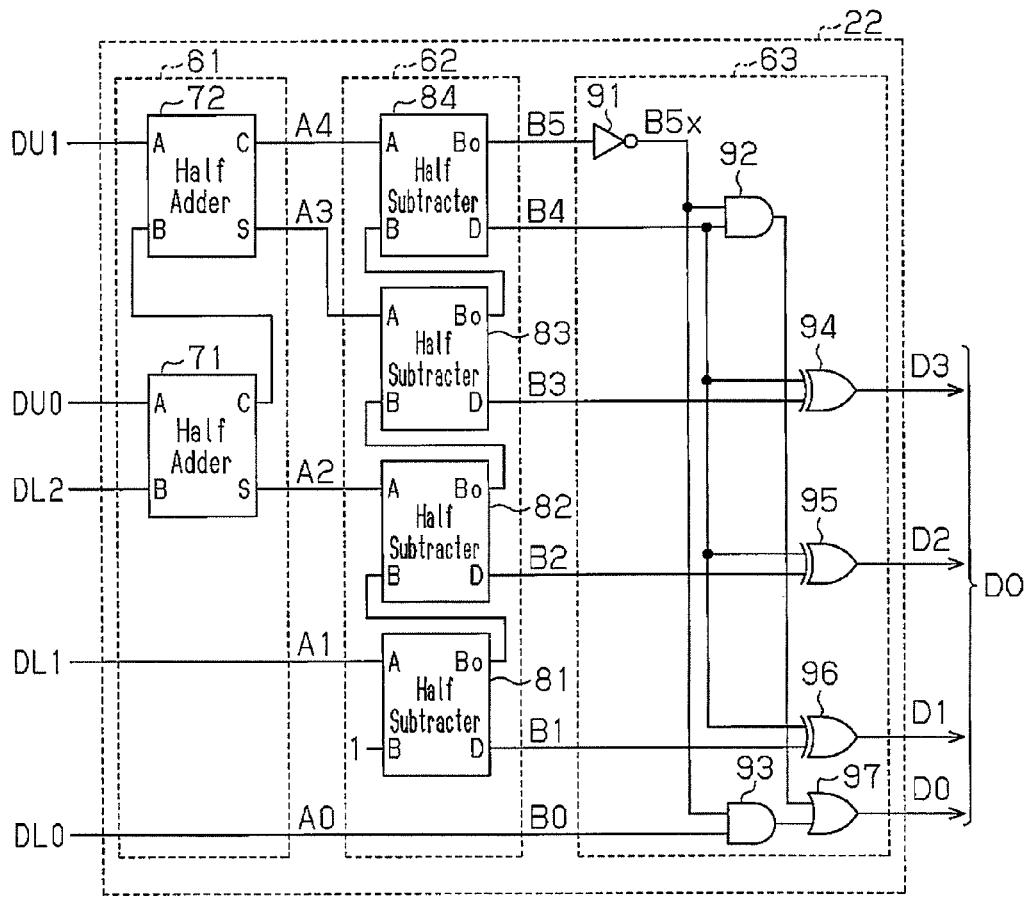
FIG. 4 is a schematic block circuit diagram illustrating a correction circuit in FIG. 1.
FIG. 5 is a view illustrating the operation of a decoder in FIG. 3.

As illustrated in FIG. 5, the decoder 32 sequentially sets one of the control signals C0 to C6 to H level (logical value "1") according to the bit values of the input signals IN2 to IN0 which indicate the count value of the counter 31 in FIG. 3, that is, the pulse of the clock signal CLK.

The FF circuits 41 to 43 and 45 of the setting registers 33 and 34 reset the control signals DU1, DU0, DL2, and DL0 in response to the control signal C0 of H level supplied to the respective reset terminals R to output the control signals DU1, DU0, DL2, and DL0 of L level.

In response to the control signal C0 of H level and the control signal C4 of L level, the OR circuit 51 generates the output signal of H level. The output signal of H level from the OR circuit 51 is supplied to the set terminal S of the FF circuit 44. When the control signal C0 is at H level, the control signal C3 supplied to the reset terminal R of the FF circuit 44 is at L level. Accordingly, the FF circuit 44 sets the control signal DL1, and outputs the control signal DL1 of H level.

In this manner, when the control signal C0 is at H level (control signals C1 to C6 are at L level), the setting register 33 generates the control signal DU "00", and the setting register 34 generates the control signal DL "010". A cycle period during the control signal C0 being at H level is referred to as reset cycle. The control signals DU and DL generated by the setting registers 33 and 34 in the reset cycle are set as respective initial values. In the embodiment illustrated in FIG. 3, the initial value of the control signal DU is "0", and the initial value of the control signal DL is "2". The initial values are set according to the number of bits Nx of the digital output signal DO and the number of bits K of the correction signal.

The FF circuit 41 sets the control signal DU1 in response to the control signal C1 of H level. The FF circuit 41 latches the comparison signal Sc supplied to an input terminal D in response to the control signal C2 of H level, and outputs the control signal DU1 having the same level as the latched level. The FF circuit 42 sets the control signal DU0 in response to the control signal C2 of H level. The FF circuit 42 latches the comparison signal Sc supplied to the input terminal D in response to the control signal C3 of H level, and outputs the control signal DU0 having the same level as the latched level.

The FF circuit 43 sets the control signal DL2 in response to the control signal C3 of H level. The FF circuit 43 latches the comparison signal Sc supplied to the input terminal D in response to the control signal C4 of H level, and outputs the control signal DL2 having the same level as the latched level. The FF circuit 44 resets the control signal DL1 in response to the control signal C3 of H level, and sets the control signal DL1 in response to the control signal C4 of H level. The FF circuit 44 latches the comparison signal Sc supplied to the input terminal D in response to the control signal C5 of H level, and outputs the control signal DL1 having the same level as the latched level. The FF circuit 45 sets the control signal DL0 in response to the control signal C5 of H level. The FF circuit 45 latches the comparison signal Sc supplied to the input terminal D in response to the control signal C6 of H level, and outputs the control signal DL0 having the same level as the latched level.

As illustrated in FIG. 4, the correction circuit 22 includes an addition circuit 61, a subtraction circuit 62, and a processing circuit 63.

The addition circuit 61 includes half adders 71 and 72. The control signal DU0 is supplied to an input terminal A of the half adder 71. The control signal DL2 is supplied to an input terminal B of the half adder 71. A carry terminal C of the half adder 71 is coupled to an input terminal B of the half adder 72. The half adder 71 adds the control signal DL2 to the control signal DU0, and outputs a signal A2 indicating an addition result from a terminal S. Further, the half adder 71 outputs the carry signal from the carry terminal C. The control signal DU1 is supplied to an input terminal A of the half adder 72. The half adder 72 adds the carry signal from the half adder 71 to the control signal DU1, and outputs a signal A3 indicating an addition result from a terminal S. Further, the half adder 72 outputs a signal A4 from the carry terminal C. Further, the addition circuit 61 outputs signals A0 and A1 having the same level (logical value) as the level (logical value) of the control signals DL0 and DL1, respectively.

The subtraction circuit 62 includes half subtracters 81 to 84. The signal A1 (control signal DL1) is supplied to an input terminal A of the half subtracter 81. A signal of a logical value of "1", which is pulled up by, for example, a resistor, is supplied to an input terminal B of the half subtracter 81. A borrow terminal Bo of the half subtracter 81 is coupled to an input terminal B of the half subtracter 82. The half subtracter 81 subtracts a logical value of "1" from the signal A1, and outputs a signal B1 indicating a subtraction result from a terminal D. Further, the half subtracter 81 outputs a borrow signal from the borrow terminal Bo. The signal A2 is supplied to the input terminal A of the half subtracter 82. A borrow terminal Bo of the half subtracter 82 is coupled to an input terminal B of the half subtracter 83. The half subtracter 82 subtracts the borrow signal of the half subtracter 81 from the signal A2, and outputs a signal B2 indicating a subtraction result from a terminal D. Further, the half subtracter 82 outputs a borrow signal from the borrow terminal Bo. The signal A3 is supplied to an input terminal A of the half subtracter 83. A borrow terminal Bo of the half subtracter 83 is coupled to an input terminal B of the half subtracter 84. The half subtracter 83 subtracts the borrow signal of the half subtracter 82 from the signal A3, and outputs a signal B3 indicating a subtraction result from a terminal D. Further, the half subtracter 83 outputs a borrow signal from the borrow terminal Bo. The signal A4 from the half adder 72 is supplied to an input terminal A of the half subtracter 84. The half subtracter 84 subtracts the borrow signal of the half subtracter 83 from the signal A4, and outputs a signal B4 indicating a subtraction result from a terminal D. Further, the half subtracter 84 outputs a signal B5 from the borrow terminal Bo. Further, the subtraction circuit 62 outputs a signal B0 having the same level as the signal A0 (control signal DL0).

The processing circuit 63 includes an inverter circuit 91, AND circuits 92 and 93, EXOR circuits 94 to 96, and an OR circuit 97. The inverter circuit 91 logically inverts the level of the signal B5 to generate an inverted signal B5x. The inverted signal B5x is supplied to the AND circuits 92 and 93. The AND circuit 92 performs a logical AND operation on the inverted signal B5x and the signal B4 to generate an output signal indicating an operation result. The AND circuit 92 performs a logical AND operation on the inverted signal B5x and the signal B0 to generate an output signal indicating an operation result. The EXOR circuit 94 performs a logical EXOR operation on the signal B4 and the signal B3 to generate an output signal D3 indicating an operation result. The EXOR circuit 95 performs a logical EXOR operation on the signal B4 and the signal B2 to generate an output signal D2 indicating an operation result. The EXOR circuit 96 performs a logical EXOR operation on the signal B4 and the signal B1 to generate an output signal D1 indicating an operation result. The OR circuit 97 performs a logical OR operation on the output signal of the AND circuit 92 and the output signal of the AND circuit 93 to generate an output signal DO indicating an operation result.

As illustrated in FIG. 6, based on the first control signal DU (DU1, DU0) and the second control signal DL (DL2 to DL0), the correction circuit 22 generates 5-bit signals A4 to A0. Further, based on the signals A4 to A0, the correction circuit 22 generates 6-bit signals B5 to B0. Then, based on the signals B5 to B0, the correction circuit 22 generates 4-bit digital output signals D3 to D0. Here, the correction circuit 22 corrects the lower 4-bit signals B3 to B0 based on the upper 2-bit signals B5 and B4, thereby generating the digital output signals D3 to D0.

The correction circuit 22 generates a sum of a value acquired by multiplying N1-bit first control signal DU (DU1, DU0) by 2^N2A (=2^(Nx−N1)) and a value of the second control signal DL (DL2 to DL0), as 5-bit signals A4 to A0. Subsequently, the correction circuit 22 generates a value acquired by subtracting the initial value of "2" from the sum (signals A4 to A0), as 6-bit signals B5 to B0. When the upper 2-bit signals B5 and B4 are "00", the correction circuit 22 generates the digital output signals D3 to D0 having the same level as the lower 4-bit signals B3 to B0.

The upper 2-bit signals B5 and B4 are "01" or "11", which means that the lower 4-bit signals B3 to B0 do not fall within the range of the digital output signals D3 to D0, that is, are in an overflow state. In this case, the correction circuit 22 executes overflow processing. When the upper 2-bit signals B5 and B4 are "01", the correction circuit 22 corrects the lower 4-bit signals B3 to B0 based on the signals B5 and B4 to generate the digital output signals D3 to D0 of "1111". When the upper 2-bit signals B5 and B4 are "11", the correction circuit 22 corrects the lower 4-bit signals B3 to B0 based on the signals B5 and B4 to generate the digital output signals D3 to D0 of "0000".

FIG. 2 illustrates the operation of the controller 21 in each comparison step and the relationship between the comparison reference signal Vref and redundancy. In FIG. 2, the high-order DAC code represents a code of the first control signal DU supplied to the first D/A converter 14, and the low-order DAC code represents a code of the second control signal DL supplied to the second D/A converter 15. The comparison reference signal Vref represents an indicator of the voltage value of the comparison reference signal Vref supplied to the comparator 12.

In the first comparison, the controller 21 sets the high-order DAC code to "2" and the low-order DAC code to "2". In this case, the comparison reference signal Vref is 8 LSB. The redundancy is ±2 LSB.

In the second comparison, the controller 21 adds "+1" to the previous value in the case of the previous comparison result of "H" to generate the high-order DAC code, and adds "−1" to the previous value in the case of the previous comparison result of "L" to generate the high-order DAC code. The low-order DAC code remains to be "2". Consequently, the comparison reference signal Vref represents 12 LSB acquired by adding +4 LSB to the previous value in the case of the previous comparison result of "H", and represents 4 LSB acquired by adding −4 LSB to the previous value in the case of the previous comparison result of "L". The redundancy is ±2 LSB.

In the third comparison, the controller 21 sets the high-order DAC code to the same value as the previous value in the case of the previous comparison result of "H", and adds "−1" to the previous value in the case of the previous comparison result of "L" to generate the high-order DAC code. The controller 21 sets the low-order DAC code to "4". Consequently, the comparison reference signal Vref represents a value acquired by adding +2 LSB to the previous value in the case of the previous comparison result of "H", and represents a value acquired by adding −2 LSB to the previous value in the case of the previous comparison result of "L".

In the fourth comparison, the controller 21 sets the high-order DAC code to the same value as the previous value. The controller 21 adds "+2" to the previous value in the case of the previous comparison result of "H" to generate the low-order DAC code, and adds "−2" to the previous value in the case of the previous comparison result of "L" to generate the low-order DAC code. Consequently, the comparison reference signal Vref represents a value acquired by adding +2 LSB to the previous value in the case of the previous comparison result of "H", and represents a value acquired by adding −2 LSB to the previous value in the case of the previous comparison result of "L".

In the fifth comparison, the controller 21 sets the high-order DAC code to the same value as the previous value. The controller 21 adds "+1" to the previous value in the case of the previous comparison result of "H" to generate the low-order DAC code, and adds "−1" to the previous value in the case of the previous comparison result of "L" to generate the low-order DAC code. Consequently, the comparison reference signal Vref represents a value acquired by adding +1 LSB to the previous value in the case of the previous comparison result of "H", and represents a value acquired by adding −1 LSB to the previous value in the case of the previous comparison result of "L".

Figure 7:
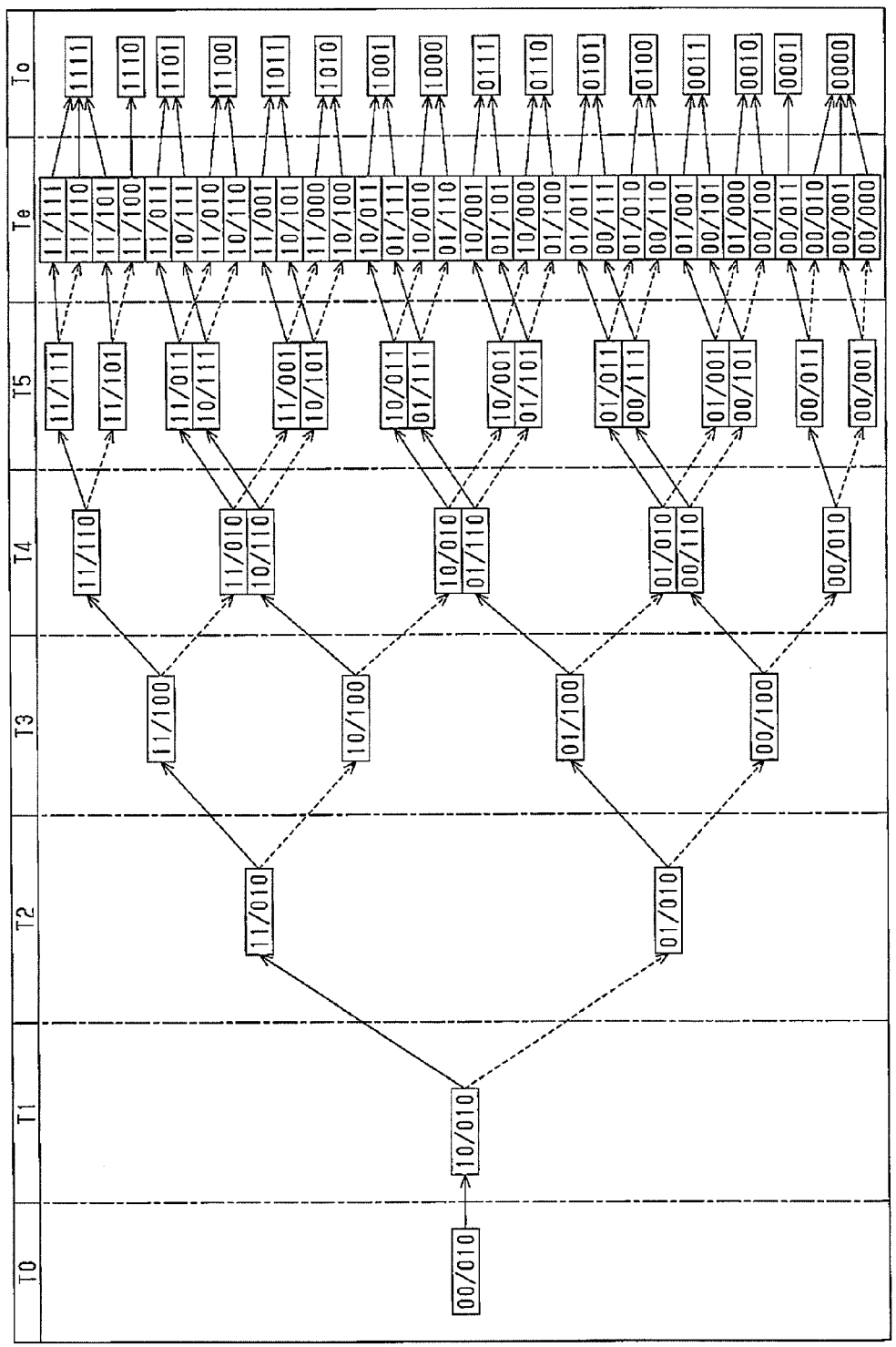
FIG. 7 is a view illustrating digitally-corrected output signals acquired when a control signal generated by the controller changes.

FIG. 7 illustrates the control signals DU and DL and the digital output signal DO, which are generated in the initialization step and each comparison step. In FIG. 7, arrows of solid lines represent the case of the comparison result of "H", and arrows of broken lines represent the case of the comparison result of "L".

FIG. 8A illustrates how the comparison reference signal Vref (comparison voltage) changes according to the result of comparison between the analog input signal VIN and the comparison reference signal Vref. FIG. 8B illustrates how the high-order DAC code (first control signal DU) and the low-order DAC code (second control signal DL) change according to the comparison signal Sc (comparison result).

The controller 21 sets the second control signal DL for the second D/A converter 15 (low-order DAC) to the initial value and performs binary search of the first D/A converter 14

(high-order DAC) to sequentially set the bit values of the first control signal DU for the first D/A converter 14. Subsequently, in the state where a binary search result is reflected on the first D/A converter 14, the controller 21 performs binary search of the second D/A converter 15 to sequentially set the bit values of the second control signal DL for the second D/A converter 15.

First, as illustrated in FIG. 8B, in the first comparison (comparison step T1), the controller 21 sets the control signal DU1 to "1" and the control signal DU0 to "0". Based on the setting, as illustrated in FIG. 8A, the comparison reference signal Vref of 8 LSB is generated. The comparator 12 compares the comparison reference signal Vref with the analog input signal VIN to generate the comparison signal Sc of L level.

Next, as illustrated in FIG. 8B, in the second comparison (comparison step T2), based on the first comparison result, that is, the comparison signal Sc of L level, the controller 21 sets the control signal DU1 to "0" and the control signal DU0 to "1". Based on the setting, as illustrated in FIG. 8A, the comparison reference signal Vref of 4 LSB is generated. The comparator 12 compares the comparison reference signal Vref with the analog input signal VIN to generate the comparison signal Sc of H level.

Next, as illustrated in FIG. 8B, in the third comparison (comparison step T3), based on the second comparison result, that is, the comparison signal Sc of H level, the controller 21 keeps the control signal DU1 and the control signal DU0 to be the previous values. Further, the controller 21 sets the control signal DL2 to "1" and the control signal DL1 to "0". Based on the setting, as illustrated in FIG. 8A, the comparison reference signal Vref of 6 LSB is generated. The comparator 12 compares the comparison reference signal Vref with the analog input signal VIN to generate the comparison signal Sc of H level.

Next, as illustrated in FIG. 8B, in the fourth comparison (comparison step T4), based on the third comparison result, that is, comparison signal Sc of H level, the controller 21 sets the control signal DL2 to "1" and the control signal DL1 to "1". Based on the setting, as illustrated in FIG. 8A, the comparison reference signal Vref of 8 LSB is generated. The comparator 12 compares the comparison reference signal Vref with the analog input signal VIN to generate the comparison signal Sc of L level.

Next, as illustrated in FIG. 8B, in the fifth comparison (comparison step T5), based on the fourth comparison result, that is, the comparison signal Sc of L level, the controller 21 sets the control signal DL1 to "0" and the control signal DL0 to "1". Based on the setting, as illustrated in FIG. 8A, the comparison reference signal Vref of 7 LSB is generated. The comparator 12 compares the comparison reference signal Vref with the analog input signal VIN to generate the comparison signal Sc of H level.

Next, as illustrated in FIG. 8B, in the comparison end step Te, based on the fifth comparison result, that is, the comparison signal Sc of H level, the controller 21 sets the control signal DL0 to "1".

In comparison steps T1 to T5 and comparison end step Te described above, the 2-bit value "01" of the first control signal DU and the 3-bit value "101" of the second control signal DL are determined.

The digital output signal DO is generated by correcting the first control signal DU and the second control signal DL. In the first D/A converter 14 (high-order DAC), the first control signal DU "01" corresponds to an analog value of 4 LSB. In the second D/A converter 15 (low-order DAC), the second control signal DL of "101" corresponds to an analog value of 5 LSB. In the initial state, the second control signal DL is set to 2 LSB. Accordingly, the digital output signal DO is generated by acquiring a sum of a value acquired by multiplying a value of the first control signal DU by 2^N2A and a value of the second control signal DL, and subtracting the initial value from the sum. That is, the digital output signal DO is generated as 7 LSB (=4 LSB+5 LSB−2 LSB).

In FIG. 8A, a hatching region represents a comparison range in each of the comparison steps T1 to T5. In the first comparison (comparison step T1), the range of the analog input signal VIN compared with the comparison reference signal Vref is 0 LSB to 16 LSB. In binary search, the comparison reference signal Vref is set to a center value of the comparison range.

Following the first comparison, the comparison range is limited to 0 LSB to 8 LSB. That is, in the second comparison (comparison step T2) in FIG. 8A, the range of the analog input signal VIN compared with the comparison reference signal Vref is 0 LSB to 8 LSB. In the second comparison, the first control signal DU of the first D/A converter 14 is set to 4 LSB. Following the second comparison, the comparison range is narrowed to 4 LSB to 8 LSB. That is, in the third comparison (comparison step T3) in FIG. 8A, the first control signal DU of the first D/A converter 14 is set to 6 LSB.

When the first control signal DU of the first D/A converter 14 is determined, binary search of the second D/A converter 15 is performed. In the A/D conversion circuit 10 in FIG. 3 and FIG. 4, the second D/A converter 15 is a 3-bit D/A converter, and the second capacitor 17 generates the second reference signal Vr2 in the range of 0 LSB to 8 LSB. When the second D/A converter 15 outputs the second reference signal Vr2 having an intermediate value (4 LSB) in the output variable range, the comparison range of the A/D conversion circuit 10 is set to 2 LSB to 10 LSB based on the first reference signal Vr1 outputted from the first D/A converter 14.

The comparison range of 2 LSB to 10 LSB overlaps a range that is not limited by the first comparison, that is, 8 LSB to 10 LSB. That is, in the third comparison, the comparison range of 2 LSB to 10 LSB overlaps a range that is not selected based on the first comparison result, and comparison with the analog input signal VIN is performed in the overlap range. Such overlap range (+2 LSB) is redundancy with the first comparison. In FIG. 8A, the overlap region is expressed by hollow arrows.

The comparison range of 2 LSB to 10 LSB overlaps a range that is not limited by the second comparison, that is, 2 LSB to 4 LSB. That is, in the third comparison, the comparison range of 2 LSB to 10 LSB overlaps a range that is not selected based on the second comparison result, and comparison with the analog input signal VIN is performed in the overlap range. Such overlap range (−2 LSB) is redundancy with the first comparison.

This also applies to the case where the analog input signal VIN is larger than 8 LSB, and redundancy of −2 LSB with respect to the first comparison is set, and this also applies to the case where the analog input signal VIN is smaller than 4 LSB, and redundancy of +2 LSB with respect to the second comparison is set. Consequently, the redundancy in the first comparison is ±2 LSB. Similarly, the redundancy in the second comparison is ±2 LSB. In FIG. 8A, the range of redundancy is expressed by arrows.

FIG. 9A illustrates how the comparison reference signal Vref (comparison voltage) changes according to the result of comparison between the analog input signal VIN and the comparison reference signal Vref. FIG. 9B illustrates how the high-order DAC code (first control signal DU) and the low-order DAC code (second control signal DL) change according to the comparison signal Sc (comparison result).

As illustrated in FIG. 9A, the comparison reference signal Vref changes depending on the capacitance values of the capacitors 16 and 17 and the like. When high-order bits are changed, that is, the control signal DU1 of the high-order DAC code (first control signal DU) is changed, the amount of change of the comparison reference signal Vref becomes maximum. It takes a relatively long time to settle the comparison reference signal Vref.

For example, when time necessary for settling the comparison reference signal Vref changes due to a change in temperature or voltage, erroneous determination (erroneous comparison) may occur. In the example illustrated in FIG. 9A, in the first comparison (comparison step T1), erroneous determination occurs, generating the comparison signal Sc of H level. In this case, as illustrated in FIG. 9B, in the second comparison (comparison step T2), based on the first comparison result (comparison signal Sc of H level), the controller 21 sets the control signal DU1 to "1" and the control signal DU0 to "1". Based on the setting, as illustrated in FIG. 9A, the comparison reference signal Vref rises to 12 LSB. As a result, the comparator 12 compares the comparison reference signal Vref with the analog input signal VIN to generate the comparison signal Sc of L level.

Next, as illustrated in FIG. 9B, in the third comparison (comparison step T3), based on the second comparison result (comparison signal Sc of L level), the controller 21 keeps the control signal DU1 to be the previous value, and sets the control signal DU0 to "0" (the previous value−1). Further, the controller 21 sets the control signal DL2 to "1" and the control signal DL1 to "0". Based on the setting, as illustrated in FIG. 9A, the comparison reference signal Vref changes to 10 LSB. In this case, by charging and discharging of the capacitors 16 and 17 illustrated in FIG. 3, the comparison reference signal Vref rises and then is settled to a set value (10 LSB). The comparator 12 compares the comparison reference signal Vref with the analog input signal VIN to generate the comparison signal Sc of L level.

In comparison step T3, the comparison range is 6 LSB to 14 LSB having the set value (10 LSB) as the center. The analog input signal VIN is included in the comparison range. That is, the analog input signal VIN is included in the range of redundancy (−2 LSB) with respect to the first comparison. Thus, the comparison reference signal Vref compared with the analog input signal VIN may be set through binary search of the low-order DAC. That is, first erroneous determination (erroneous determination of the high-order DAC) may be corrected by binary search of the low-order DAC.

Next, as illustrated in FIG. 9B, in the fourth comparison (comparison step T4), based on the third comparison result, that is, the comparison signal Sc of L level, the controller 21 sets the control signal DL2 to "0" and the control signal DL1 to "1". Based on the setting, as illustrated in FIG. 9A, the comparison reference signal Vref changes to 8 LSB. The comparator 12 compares the comparison reference signal Vref with the analog input signal VIN to generate the comparison signal Sc of L level.

Next, as illustrated in FIG. 9B, in the fifth comparison (comparison step T5), based on the fourth comparison result, that is, the comparison signal Sc of L level, the controller 21 sets the control signal DL1 to "0", and control signal DL0 to "1". Based on the setting, as illustrated in FIG. 9A, the comparison reference signal Vref changes to 7 LSB. The comparator 12 compares the comparison reference signal Vref with the analog input signal VIN to generate the comparison signal Sc of H level.

Next, as illustrated in FIG. 9B, in comparison end step Te, based on the fifth comparison result, that is, the comparison signal Sc of H level, the controller 21 sets the control signal DL0 to "1".

In comparison steps T1 to T5 and comparison end step Te described above, the 2-bit value "10" of the first control signal DU and the 3-bit value "001" of the second control signal DL are determined. The digital output signal DO is generated by correcting the first control signal DU and the second control signal DL. In this case, the digital output signal DO is generated as 7 LSB (=8 LSB+1 LSB−2 LSB). This generates the same result as in the case where erroneous determination does not occur.

Next, an A/D conversion circuit 200 in a comparison example will now be described below.

Figure 13:
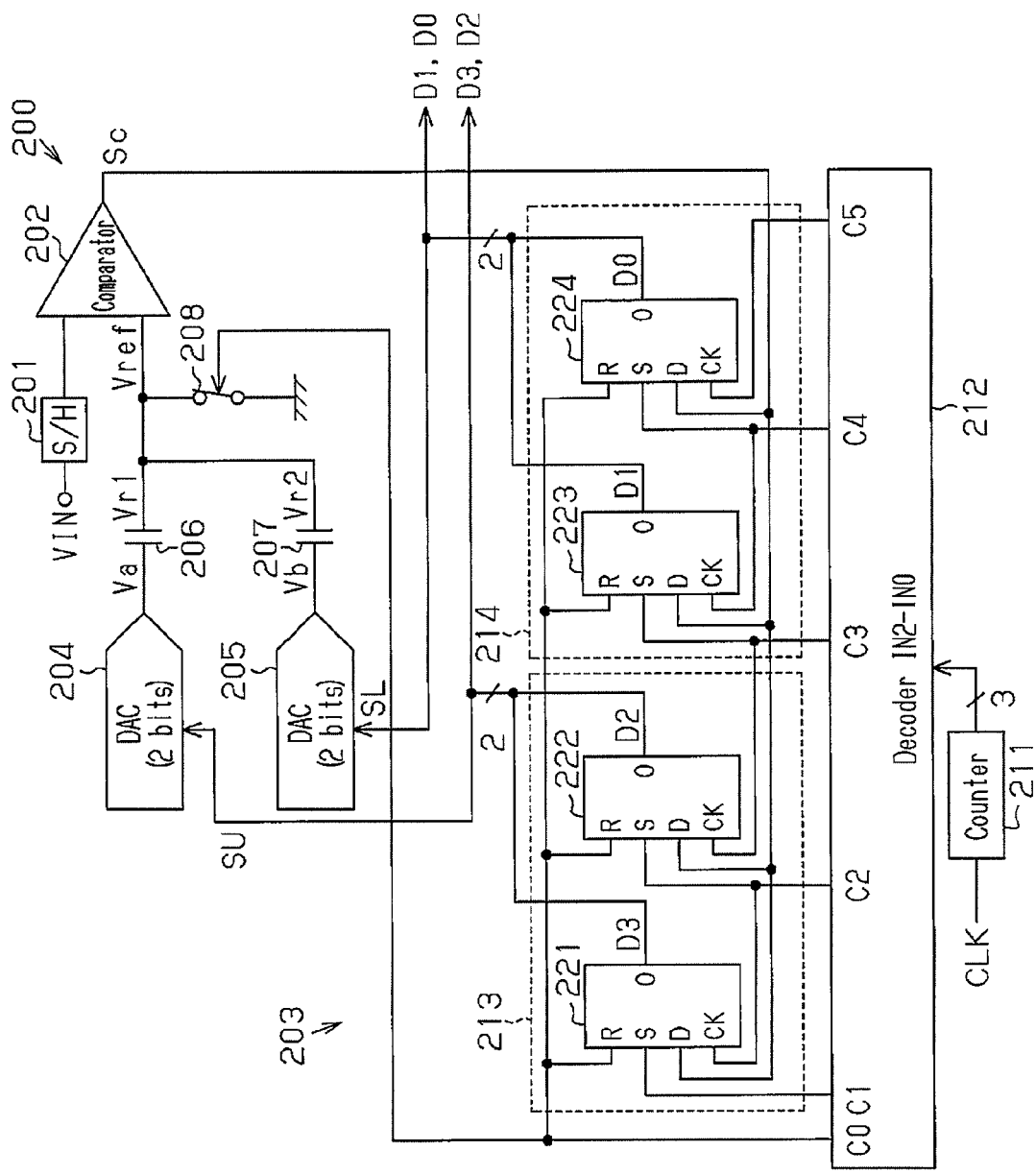
FIG. 13 is a schematic block circuit diagram illustrating an analog-digital conversion circuit in a comparison example.

As illustrated in FIG. 13, the A/D conversion circuit 200 converts the analog input signal VIN into 4-bit digital output signal DO (D3 to D0).

A/D conversion circuit 200 includes a sample-hold circuit 201, a comparator 202, an SAR logic circuit 203, digital-analog converters (hereinafter referred to as D/A converter) 204 and 205, capacitors 206 and 207, and a switch 208.

The sample-hold circuit 201 performs in the same manner as the sample-hold circuit 11 in FIG. 1. The comparator 202 performs in the same manner as the comparator 12 in FIG. 1.

The first D/A converter 204 and the second D/A converter 205 each are a 2-bit D/A converter. The capacitor 207 coupled to the output terminal of the second D/A converter 205 has a reference capacitance value C. The capacitor 206 coupled to the output terminal of the first D/A converter 204 has a capacitance value C*2^2 corresponding to the number of bits of the second D/A converter 205.

The SAR logic circuit 203 generates a first control signal SU for the first D/A converter 204 and a second control signal SL for the second D/A converter 205. Based on the comparison result, that is, the comparison signal Sc from the comparator 202, the SAR logic circuit 203 sequentially sets bit values of the first control signal SU and bit values of the second control signal SL. The first control signal SU is generated as upper 2-bit digital output signals D3 and D2, and the second control signal SL is generated as lower 2-bit digital output signals D1 and D0.

The SAR logic circuit 203 includes a counter 211, a decoder 212, and setting registers 213 and 214. The setting register 213 corresponding to the high-order DAC code (first control signal SU) includes flip-flop circuits 221 and 222. The setting register 214 corresponding to the low-order DAC code (second control signal SL) includes flip-flop circuits 223 and 224.

The A/D conversion circuit 200 sets the comparison reference signal Vref though binary search, and repeats the operation of comparing the comparison reference signal Vref with the analog input signal VIN four times, thereby setting the bit values of the first and second control signals SU and SL.

As illustrated in FIG. 14A, the comparison reference signal Vref changes depending on the capacitance value of the capacitors 206 and 207 and the like. When the high-order bits are changed, that is, the output signal D3 of the high-order DAC code (first control signal SU) is changed, the amount of change of the comparison reference signal Vref becomes maximum. It takes a relatively long time to settle the comparison reference signal Vref.

For example, when time necessary for settling the comparison reference signal Vref changes due to a change in temperature or voltage, erroneous determination (erroneous comparison) may occur. In the example illustrated in FIG. 14A, in the first comparison (comparison step T1), erroneous determination occurs, generating the comparison signal Sc of H level. In this case, as illustrated in FIG. 14B, in the second comparison (comparison step T2), based on the first comparison result (comparison signal Sc of H level), the SAR logic circuit 203 sets the output signal D3 to "1" and the output signal D2 to "1". Based on the setting, as illustrated in FIG. 14A, the comparison reference signal Vref rises to 12 LSB. As a result, the comparator 202 compares the comparison reference signal Vref with the analog input signal VIN to generate the comparison signal Sc of L level.

Next, as illustrated in FIG. 14B, in the third comparison (comparison step T3), based on the second comparison result (comparison signal Sc of L level), the SAR logic circuit 203 keeps the output signal D3 to be the previous value, and sets the output signal D2 to "0" (the previous value−1). Further, the SAR logic circuit 203 sets the output signal D1 to "1" and the output signal D0 to "0". Based on the setting, as illustrated in FIG. 14A, the comparison reference signal Vref lowers to 10 LSB. The comparator 202 compares the comparison reference signal Vref with the analog input signal VIN to generate the comparison signal Sc of L level.

Next, in the fourth comparison (comparison step T4), based on the third comparison result (comparison signal Sc of L level), the SAR logic circuit 203 sets the output signal D1 to "0" and the output signal D0 to "1". Based on the setting, as illustrated in FIG. 14A, the comparison reference signal Vref changes to 9 LSB. The comparator 202 compares the comparison reference signal Vref with the analog input signal VIN to generate the comparison signal Sc of L level.

Next, in comparison end step Te, based on the fourth comparison result, that is, the comparison signal Sc of L level, the SAR logic circuit 203 sets the output signal D0 to "0".

In comparison steps T1 to T4 and comparison end step Te described above, 2-bit value "10" of the first control signal SU and 2-bit value "00" of the second control signal SL are determined. In this case, the digital output signal DO is generated as 8 LSB and includes an error of ±0.5 LSB or more from the analog input signal VIN.

In the A/D conversion circuit 200 illustrated in FIG. 13, the 2-bit D/A converters 204 and 205 may generate the control signals SU and SL according to a non-binary search algorism such that the comparison reference signal Vref has redundancy. In this case, the configuration of the SAR logic circuit 203 in FIG. 13 is changed.

FIG. 15 illustrates the setting of the comparison reference signal Vref in non-binary search and the redundancy.

First, in the first comparison, the comparison reference signal Vref is set to 8 LSB. The redundancy is ±2 LSB.

Next, in the second comparison, when the previous comparison result is "H", a new comparison reference signal Vref is generated by adding +3 LSB to the previous comparison reference signal Vref. When the previous comparison result is "L", a new comparison reference signal Vref is generated by adding −3 LSB to the previous comparison reference signal Vref. The redundancy is ±1 LSB.

In the third comparison, when the previous comparison result is "H", a new comparison reference signal Vref is generated by adding +2 LSB to the previous comparison reference signal Vref. When the previous comparison result is "L", a new comparison reference signal Vref is generated by adding −2 LSB to the previous comparison reference signal Vref. The redundancy is ±1 LSB.

Next, in the fourth comparison, when the previous comparison result is "H", a new comparison reference signal Vref is generated by adding +1 LSB to the previous comparison reference signal Vref. When the previous comparison result is "L", a new comparison reference signal Vref is generated by adding −1 LSB to the previous comparison reference signal Vref. In this case, there is no redundancy.

Then, in the fifth comparison, when the previous comparison result is "H", a new comparison reference signal Vref is generated by adding +1 LSB to the previous comparison reference signal Vref. When the previous comparison result is "L", a new comparison reference signal Vref is generated by adding −1 LSB to the previous comparison reference signal Vref. In this case, there is no redundancy.

FIG. 16A illustrates a change in the comparison reference signal Vref in non-binary search, and FIG. 16B illustrates setting of the control signals SU and SL with respect to the comparison signal Sc.

As illustrated in FIG. 16A, in the first comparison (comparison step T1), the comparison reference signal Vref changes in the same manner as the comparison reference signal Vref in FIG. 14. Therefore, in the first comparison, erroneous determination occurs, generating the comparison signal Sc of H level. In this case, as illustrated in FIG. 16B, in the second comparison (comparison step T2), based on the first comparison result (comparison signal Sc of H level), the SAR logic circuit 203 sets the output signal D3 to "1", the output signal D2 to "0", the output signal D1 to "1", and the output signal D0 to "1". Based on the setting, as illustrated in FIG. 16A, the comparison reference signal Vref rises to 11 LSB. The comparator 202 compares the comparison reference signal Vref with the analog input signal VIN to generate the comparison signal Sc of L level.

Next, as illustrated in FIG. 16B, in the third comparison (comparison step T3), based on the second comparison result (comparison signal Sc of L level), the SAR logic circuit 203 sets the output signal D3 to "1" and the output signal D2 to "0". Further, the SAR logic circuit 203 sets the output signal D1 to "0" and the output signal D0 to "1". Based on the setting, as illustrated in FIG. 16A, the comparison reference signal Vref changes to 9 LSB. The comparator 202 compares the comparison reference signal Vref with the analog input signal VIN to generate the comparison signal Sc of L level.

Next, in the fourth comparison (comparison step T4), based on the third comparison result (comparison signal Sc of L level), the SAR logic circuit 203 sets the output signal D3 to "1" and the output signal D2 to "0". Further, the SAR logic circuit 203 sets the output signal D1 to "0" and the output signal D0 to "0". Based on the setting, as illustrated in FIG. 16A, the comparison reference signal Vref changes to 8 LSB. The comparator 202 compares the comparison reference signal Vref with the analog input signal VIN to generate the comparison signal Sc of L level.

Next, in the fifth comparison (comparison step T5), based on the fourth comparison result (comparison signal Sc of L level), the SAR logic circuit 203 sets the output signal D3 to "0" and the output signal D2 to "1". Further, the SAR logic circuit 203 sets the output signal D1 to "1" and the output signal D0 to "1". At this time, comparison reference signal Vref largely rises by charging in the capacitor 207 having a small capacitance value and then, lowers to a set value (7 LSB) by discharging in the capacitor 206. Such change in the comparison reference signal Vref contributes to erroneous determination. That is, the comparison signal Sc of L level is generated. As a result, as illustrated in FIG. 16B, in Comparison end step Te, based on the fifth comparison result, that is, the comparison signal Sc of L level, the SAR logic circuit 203 sets the output signal D3 to "0" and the output signal D2 to "1". Further, the SAR logic circuit 203 sets the output signal D1 to "1" and the output signal D0 to "0". Consequently, the digital output signal DO is generated as 6 LSB, and includes an error of ±0.5 LSB or more from the analog input signal VIN. That is, in non-binary search, the output signal to the high-order DAC is changed when the low-order DAC code is set, erroneous determination may occur. Since redundancy is not set in such comparison step, the error caused by erroneous determination may not be corrected.

On the contrary, in the A/D conversion circuit 10 in the embodiment, when the second control signal DL (low-order DAC code) for the second D/A converter 15 (low-order DAC) is set, the first control signal DU for the first D/A converter 14 (high-order DAC) is not changed. Thus, a large change in the comparison reference signal Vref is suppressed. This suppresses the occurrence of erroneous determination in the comparison step in which redundancy is not set. Thus, the accuracy of the digital output signal DO is suppressed from lowering.

Next, the conversion rate of the A/D conversion circuit 10 will now be described.

The conversion rate corresponds to the settling time of the comparison reference signal Vref generated from the output signals Va and Vb of the D/A converters 14 and 15 illustrated in FIG. 1. In the A/D conversion circuit 10, the comparison step transits according to the cycles of the clock signal CLK. In the A/D conversion circuit having no redundancy, the comparison reference signal Vref has to be settled to a required level within 0.5 LSB. In the A/D conversion circuit having redundancy, the comparison reference signal Vref has to be settled to a required level within the redundancy+0.5 LSB. One cycle time is set to be longer than settling time at the time when the comparison reference signal Vref changes the most.

Conversion time of the A/D conversion circuit for generating 4-bit digital output signal DO, that is, the A/D conversion circuit 10 illustrated in FIG. 3 and FIG. 4 and conversion time of the A/D conversion circuit 200 illustrated in FIG. 13 will now be described below.

In the non-binary search algorism illustrated in FIG. 15, settling time necessary for each of five comparisons in the D/A converters 204 and 205 will now be described.

For example, in FIG. 13, an output impedance of each of the D/A converters 204 and 205 is defined as R, and an input capacitance of the comparator 202 is defined as C.

The capacitance value with respect to the D/A converter 204 is set as follows.

$$C*1/(1/4+1/(1+1))=C*1.33$$

The capacitance value with respect to the D/A converter 205 is set as follows.

$$C*1/(1/1+1/(4+1))=C*0.83$$

Thus, settling time in each comparison step is as follows.

First time: $-\ln(2.5/8)*R*C*1.33=1.16*R*C*1.33=1.54*R*C$

Second time: $-\ln(1.5/4)*R*C*1.33=1.67*R*C*1.33=2.22*R*C$

Third time: $-\ln(1.5/4)*R*C*1.33=0.98*R*C*1.33=1.30*R*C$

Fourth time: $-\ln(0.5/8)*R*C*1.33=2.77*R*C*1.33=3.68*R*C$

Fifth time: $-\ln(0.5/8)*R*C*1.33=2.77*R*C*1.33=3.68*R*C$

Accordingly, time required to complete conversion is as follows.

$$3.68*R*C*5=18.40*R*C$$

Next, the A/D conversion circuit 10 in this embodiment will now be described.

Similarly, in FIG. 3, an output impedance of each of the D/A converters 14 and 15 is defined as R, and an input capacitance of the comparator 12 is defined as C.

The capacitance value with respect to the D/A converter 14 is set as follows.

$$C*1/(1/4+1/(2+1))=C*1.71$$

The capacitance value with respect to the D/A converter 15 is set as follows.

$$C*1/(1/2+1/(4+1))=C*1.43$$

Thus, the settling time in each comparison step is set as follows.

First time: $-\ln(2.5/8)*R*C*1.71=1.16*R*C*1.71=1.98*R*C$

Second time: $-\ln(2.5/8)*R*C*1.71=1.16*R*C*1.71=1.98*R*C$

Third time: $-\ln(0.5/4)*R*C*1.71=2.1*R*C*1.71=3.59*R*C$

Fourth time: $-\ln(0.5/4)*R*C*1.43=2.1*R*C*1.43=3.00*R*C$

Fifth time: $-\ln(0.5/2)*R*C*1.43=1.4*R*C*1.43=2.00*R*C$

Accordingly, time required to complete conversion is as follows.

$$3.59*R*C*5=17.95*R*C$$

Thus, as compared with the comparison example, in this embodiment, each comparison cycle time (for example, one cycle of the clock signal CLK (one cycle time)) may be decreased. As a result, time required to complete A/D conversion may be decreased. As the number of bits of the digital output signal DO is larger, the time is decreased.

For example, in the 10-bit A/D conversion circuit (5-bit high-order DAC and 5-bit low-order DAC), the capacitance value with respect to the high-order DAC is set as follows.

$$C*1/(1/32+1/(1+6))=C*5.74$$

The capacitance value with respect to the low-order DAC is set as follows.

$$C*1/(1/1+1/(32+6))=C*0.97$$

Thus, in non-binary search, the settling time when the output signal D3 changes in the tenth comparison is as follows.

$$-\ln(0.5/512)*R*C*5.74=6.93*R*C*5.74=39.79*R*C$$

Accordingly, time required to complete conversion is as follows.

$$39.79*R*C*11=437.69*R*C$$

On the contrary, in binary search, the settling time in the first comparison is the longest as described below.

$$-\ln(0.5/512)*R*C*5.74=6.93*R*C*5.74=39.79*R*C$$

Accordingly, time required to complete conversion is as follows.

$$39.79*R*C*10=397.90*R*C$$

In this embodiment, the high-order DAC is set to 5 bits, and the low-order DAC is set to 6 bits. The capacitance value with respect to the high-order DAC is set as follows.

$$C*1/(1/32+1/(2+6))=C*6.40$$

The capacitance value with respect to the low-order DAC is set as follows.

$$C*1/(1/2+1/(32+6))=C*1.90$$

In this case, the settling time in the sixth comparison is the longest as described below.

$$-\ln(0.5/32)*R*C*6.40=4.16*R*C*6.40=26.62*R*C$$

Accordingly, time required to complete conversion is as follows.

$$26.62*R*C*11=292.82*R*C$$

Thus, as compared with the comparison example (binary search and non-binary search using 5-bit high-order DAC and low-order DAC), time required to complete conversion is decreased.

The present embodiment has the advantages described below.

(1) The A/D conversion circuit 10 converts the analog input signal VIN into Nx (=N1+N2A)-bit digital output signal DO. The A/D conversion circuit 10 includes the first D/A converter 14 and the second D/A converter 15. The first D/A converter 14 generates the output signal Va based on the first control signal DU of N1 bits corresponding to the number of high-order bits of the digital output signal DO. The second D/A converter 15 generates the output signal Vb based on the second control signal DL of N2B (=N2A+K) bits corresponding to the sum of the number of low-order bits N2A of the digital output signal DO and the number of bits K of the correction signal. The comparison reference signal Vref is generated according to the output signal Va of the first D/A converter 14 and the output signal Vb of the second D/A converter 15. The comparator 12 compares the comparison reference signal Vref with the analog input signal VIN to generate the comparison signal Sc. The SAR logic circuit 13 includes the controller 21 and the correction circuit 22. The controller 21 sets the bit values of the first control signal DU and the bit values of the second control signal DL in accordance with the comparison signal Sc. The correction circuit 22 generates the digital output signal DO based on the sum of the value acquired by multiplying the value of the first control signal DU by 2^(Nx−N1) and the value of the second control signal DL.

The number of bits of the second control signal DL supplied to the second D/A converter 15 is set to N2B bits corresponding to the sum of the number of low-order bits N2A of the digital output signal DO and the number of bits K of the correction signal. With this configuration, the comparison range used in comparison with the comparison reference signal Vref changed based on the output signal Vb of the second D/A converter 15 overlaps the comparison range used in comparison with the comparison reference signal Vref generated based on the output signal Va of the first D/A converter 14. Thus, the result of erroneous determination may be corrected by using redundancy caused by overlapping. This may prevent the accuracy of the digital output signal DO from lowering.

(2) The number of bits, and the output voltage range, of the second D/A converter 15 are set such that the second reference signal Vr2 is generated in the voltage range that is larger than the amount of change of the output voltage (first reference signal Vr1) of the first D/A converter 14 in one step. Then, the comparison reference signal Vref offset from the composite voltage of the first and second reference signals Vr1 and Vr2 according to the number of bits K of the correction signal is supplied to the comparator 12. The comparator 12 compares the comparison reference signal Vref with the analog input signal VIN to generate the comparison signal Sc indicating the comparison result.

When values of the low-order bits of the control signal DL are sequentially determined, the comparison reference signal Vref having the same value is generated without changing the bit values of the control signal DU. For example, in both of the cases where "11/100" is changed to "11/010" and where "10/100" is changed to "10/110", the same comparison reference signal Vref of 12 LSB is supplied to the comparator 12. In this case, in comparison steps T4 and T5, the first reference signal Vr1 does not change with respect to the capacitor 16 having a large capacitance value. Thus, a large change in the comparison reference signal Vref is suppressed. This suppresses erroneous determination at the time when the values of the low-order bits of the control signal DL are determined. As a result, the digital output signal DO may be generated with high accuracy.

It should be apparent to those skilled in the art that the above embodiment may be embodied in many other specific forms without departing from the scope of the invention. Particularly, it should be understood that the above embodiment may be embodied in the following forms.

In the embodiment, the number of bits Nx of the digital output signal DO, the number of bits N1 of the first D/A converter 14, the number of bits N2B of the second D/A converter 15, and the number of bits K of the correction signal may be appropriately changed. For example, the number of bits Nx of the digital output signal DO may be "6", the number of bits N1 of the first D/A converter 14 may be "3", the number of bits N2B of the second D/A converter 15 (=N2A+K) may be "5", and the number of bits K of the correction signal may be "2". Alternatively, the number of bits Nx of the digital output signal DO may be "6", the number of bits N1 of the first D/A converter 14 may be "4", the number of bits N2B of the second D/A converter 15 may be "5", and the number of bits K of the correction signal may be "3".

In the embodiment, the reference voltages VRH and VRL having the same voltage value is supplied to the first D/A converter 14 and the second D/A converter 15. The first reference signal Vr1 in the range of 0 to 16 LSB and the second reference signal Vr2 in the range of 0 to 8 LSB are generated based on the capacitance ratio of the capacitors 16 and 17. However, as long as the desired comparison reference signal Vref may be generated, the reference voltages VRH and VRL supplied to the D/A converters 14 and 15 and the capacitance ratio of the capacitors 16 and 17 may be appropriately changed.

For example, the reference voltage having the same voltage value as the voltage range FSR of the analog input signal VIN may be supplied to the first D/A converter 14, and the reference voltage having a voltage value of ½ of the voltage range FSR may be supplied to the second D/A converter 15. The low potential-side reference voltage VRL supplied to the D/A converters 14 and 15 is 0[V]. The capacitance value of the capacitors 16 and 17 is set to the reference capacitance C.

An amplifier for amplifying the output signal Va of the first D/A converter 14 and an amplifier for amplifying the output signal Vb of the second D/A converter 15 may be provided. In this case, the capacitance values C1 and C2 of the capacitors 16 and 17 may be set according to amplification ratios of the respective amplifiers.

At least one of the first D/A converter 14 and the second D/A converter 15 may be a current output digital-analog converter.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments of the present invention have been described in detail, it should be understood that various changes, substitutions, and alterations could be made hereto without departing from the spirit and scope of the invention.

The invention claimed is:

1. An analog-digital conversion circuit that converts an analog input signal into a digital output signal, the analog-digital conversion circuit comprising:
   a comparator including a first input terminal that receives the analog input signal;
   a controller configured to generate a first signal and a second signal in accordance with an output signal from the comparator;
   a first digital-analog converter configured to generate a first reference signal based on the first signal;
   a second digital-analog converter configured to generate a second reference signal based on the second signal;
   a first capacitive element including a first terminal that receives the first reference signal and a second terminal coupled to a second input terminal of the comparator;
   a second capacitive element including a first terminal that receives the second reference signal and a second terminal coupled to the second input terminal of the comparator; and
   a correction circuit configured to correct the first signal and the second signal to generate the digital output signal, wherein
   the first signal is an N1-bit digital signal,
   the second signal is an N2B-bit digital signal acquired by adding a Kbit correction signal to an N2A-bit signal,
   the controller is configured to sequentially set bit values of the first signal and bit values of the second signal in accordance with the output signal of the comparator, and
   the correction circuit is configured to generate the digital output signal of (N1+N2A) bits based on a sum of a value acquired by multiplying the N1-bit digital signal generated by the controller by 2^N2A and a value of the N2B-bit digital signal generated by the controller.

2. The analog-digital conversion circuit according to claim 1, wherein
   the controller is configured to set the bit values of the second signal through binary search after setting the bit values of the first signal through binary search.

3. The analog-digital conversion circuit according to claim 1, wherein
   the controller is configured to set an initial value according to the correction signal to the first signal and the second signal and control a switch coupled to a node between the first capacitive element, the second capacitive element, and the comparator to initialize an electrical charge of each of the first and second capacitive elements.

4. The analog-digital conversion circuit according to claim 3, wherein
   the correction circuit is configured to generate a signal having low-order (N1+N2A) bits and high-order bits by subtracting the initial value from the sum and generate the digital output signal by correcting the low-order (N1+N2A) bits based on the high-order bits.

5. The analog-digital conversion circuit according to claim 1, wherein
   a ratio of a capacitance value of the first capacitive element to a capacitance value of the second capacitive element is set according to the number of bits (K) of the correction signal and a difference (N2A) between the number of bits (N1+N2A) of the digital output signal and the number of bits (N1) of the first signal.

6. An analog-digital conversion circuit that converts an analog input signal into a digital output signal, the analog-digital conversion circuit comprising:
   a first digital-analog converter configured to output a signal according to a first signal;
   a second digital-analog converter configured to output a signal according to a second signal;
   a signal generation circuit configured to generate a comparison reference signal based on an initial value according to the number of bits of a correction signal, an output signal of the first digital-analog converter, and an output signal of the second digital-analog converter;
   a comparator configured to compare the analog input signal with the comparison reference signal to generate a comparison signal;
   a controller configured to control the first and second digital-analog converters in accordance with the comparison signal; and
   a correction circuit configured to correct the first signal and the second signal to generate the digital output signal, wherein
   the first signal is an N1-bit digital signal,
   the second signal is an N2B-bit digital signal acquired by adding the Kbit correction signal to an N2A-bit signal,
   the controller sequentially is configured to set bit values of the first signal and bit values of the second signal in accordance with the comparison signal, and
   the correction circuit is configured to generate the digital output signal of (N1+N2A) bits based on a sum of a value acquired by multiplying the N1-bit digital signal generated by the controller by 2^N2A and a value of the N2B-bit digital signal generated by the controller.

7. The analog-digital conversion circuit according to claim 6, wherein the signal generation circuit includes
   a first capacitive element including a first terminal coupled to the first digital-analog converter and a second terminal coupled to the comparator,
   a second capacitive element including a first terminal coupled to the second digital-analog converter and a second terminal coupled to the comparator, and
   a switch coupled to a node between the first capacitive element, the second capacitive element, and the comparator.

8. An analog-digital conversion method for converting an analog input signal into a digital output signal, the method comprising:
   generating a first reference signal based on an N1-bit first signal;
   generating a second reference signal based on an (N2A+K)-bit second signal including a Kbit correction signal;
   combining the first reference signal with the second reference signal to generate a comparison reference signal;
   comparing the analog input signal with the comparison reference signal to generate a comparison signal;
   setting bit values of the first signal according to the comparison signal through binary search;
   after setting the bit values of the first signal, setting bit values of the second signal according to the comparison signal through binary search; and generating the digital output signal of (N1+N2A) bits based on a sum of a value acquired by multiplying the N1-bit first signal by 2^N2A and a value of the (N2A+K)-bit second signal.

\* \* \* \* \*